US012603028B2

(12) United States Patent
Ma et al.

(10) Patent No.: US 12,603,028 B2
(45) Date of Patent: Apr. 14, 2026

(54) DISPLAY PANEL AND DISPLAY APPARATUS HAVING IMPROVED SCREEN-TO-BODY RATIO

(71) Applicant: Wuhan Tianma Micro-Electronics Co., Ltd., Wuhan (CN)

(72) Inventors: Yangzhao Ma, Wuhan (CN); Hao Dai, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 536 days.

(21) Appl. No.: 18/075,700

(22) Filed: Dec. 6, 2022

(65) Prior Publication Data

US 2024/0080973 A1     Mar. 7, 2024

(30) Foreign Application Priority Data

Sep. 5, 2022    (CN) .......................... 202211080077.5

(51) Int. Cl.
*G09G 3/20*        (2006.01)
(52) U.S. Cl.
CPC ....... *G09G 3/20* (2013.01); *G09G 2320/0209* (2013.01); *G09G 2320/0223* (2013.01); *H05K 2201/09227* (2013.01)
(58) Field of Classification Search
CPC ....................................................... G09G 3/20
See application file for complete search history.

(56) References Cited

U.S. PATENT DOCUMENTS

| | | | |
|---|---|---|---|
| 2009/0051636 A1* | 2/2009 | Natori .................. | G09G 3/3648 |
| | | | 345/55 |
| 2010/0053058 A1* | 3/2010 | Nagashima .............. | G09G 3/36 |
| | | | 345/98 |
| 2016/0019856 A1* | 1/2016 | Tanaka ................. | G09G 3/3666 |
| | | | 345/206 |
| 2017/0154566 A1* | 6/2017 | Ryoo ................... | H10K 59/131 |
| 2017/0288003 A1* | 10/2017 | Kim ..................... | H10K 59/123 |

(Continued)

FOREIGN PATENT DOCUMENTS

| | | |
|---|---|---|
| CN | 108957881 A | 12/2018 |
| CN | 110610667 A | 12/2019 |

(Continued)

*Primary Examiner* — William Boddie
*Assistant Examiner* — Andrew B Schnirel
(74) *Attorney, Agent, or Firm* — Anova Law Group, PLLC

(57) ABSTRACT

A display panel and a display apparatus are provided in the present disclosure. The display panel includes a display region, a functional device configuration region, and a plurality of data lines which extends along a first direction. A second data line of the plurality of data lines includes a first sub-data-line and a second sub-data-line; and along the first direction, the first sub-data-line and the second sub-data-line in a same second data line are respectively arranged on two sides of the functional device configuration region. The display panel further includes first-wirings extending along the first direction and second-wirings extending along a second direction. One end of the second-wiring is electrically connected to the first-wiring, and another end of the second-wiring is electrically connected to a first data line of the first data lines; and the second-wirings include first sub-second-wirings and second sub-second-wirings.

26 Claims, 16 Drawing Sheets

(56)     References Cited

U.S. PATENT DOCUMENTS

| | | | |
|---|---|---|---|
| 2019/0123066 A1* | 4/2019 | Zhan ................... | H10D 86/411 |
| 2019/0261512 A1* | 8/2019 | Huang ................. | H05K 1/115 |
| 2020/0064702 A1* | 2/2020 | Yeh ..................... | H10K 59/122 |
| 2021/0303040 A1* | 9/2021 | Choi ................... | G06F 1/1686 |
| 2023/0043145 A1* | 2/2023 | Yuan .................. | G09G 3/3258 |

FOREIGN PATENT DOCUMENTS

| | | |
|---|---|---|
| CN | 113471252 A | 10/2021 |
| CN | 114730538 A | 7/2022 |
| CN | 114843283 A | 8/2022 |

* cited by examiner

<u>200</u>

100

1

DISPLAY PANEL AND DISPLAY APPARATUS HAVING IMPROVED SCREEN-TO-BODY RATIO

CROSS-REFERENCE TO RELATED APPLICATION

The present application claims the priority of Chinese Patent Application No. 202211080077.5, filed on Sep. 5, 2022, the content of which is incorporated herein by reference in its entirety.

TECHNICAL FIELD

The present disclosure generally relates to the field of display technology and, more particularly, relates to a display panel and a display apparatus.

BACKGROUND

With development of the information society, the requirements for display apparatuses for displaying information are also increasing. Therefore, users have higher demands for flat panel display apparatuses with small size, light weight and desirable display effect.

In recent years, the use of display apparatuses has been diversified and generalized. On the basis that display apparatuses have become thinner and lighter, users have higher requirements for the screen-to-body ratios of display apparatuses. Therefore, there is a need to develop display panels and display apparatuses with expanded display regions.

SUMMARY

One aspect of the present disclosure provides a display panel. The display panel includes a display region and at least one functional device configuration region, where the display region at least partially surrounds the at least one functional device configuration region; a plurality of data lines which extends along a first direction and is arranged along a second direction, where the plurality of data lines includes a plurality of first data lines and a plurality of second data lines; a second data line of the plurality of second data lines includes a first sub-data-line and a second sub-data-line; and along the first direction, a first sub-data-line and a second sub-data-line in a same second data line are respectively arranged on two sides of the functional device configuration region; and a plurality of first-wirings extending along the first direction, and a plurality of second-wirings extending along the second direction. One end of at least a part of the plurality of second-wirings is electrically connected to a first-wiring of the plurality of first-wirings, and another end of the at least the part of the plurality of second-wirings is electrically connected to a first data line of the plurality of first data lines; and the plurality of second-wirings include a plurality of first sub-second-wirings and a plurality of second sub-second-wirings; one end of at least a part of the plurality of first sub-second-wirings and one end of at least a part of the plurality of second sub-second-wirings are both electrically connected to a same first-wiring; another end of the at least the part of the plurality of first sub-second-wirings is electrically connected to the first sub-data-line; and another end of the at least the part of the plurality of second sub-second-wirings is electrically connected to the second sub-data-line in the same second data line corresponding to the first sub-data-line.

2

Another aspect of the present disclosure provides a display apparatus including a display panel. The display panel includes a display region and at least one functional device configuration region, where the display region at least partially surrounds the at least one functional device configuration region; a plurality of data lines which extends along a first direction and is arranged along a second direction, where the plurality of data lines includes a plurality of first data lines and a plurality of second data lines; a second data line of the plurality of second data lines includes a first sub-data-line and a second sub-data-line; and along the first direction, a first sub-data-line and a second sub-data-line in a same second data line are respectively arranged on two sides of the functional device configuration region; and a plurality of first-wirings extending along the first direction, and a plurality of second-wirings extending along the second direction. One end of at least a part of the plurality of second-wirings is electrically connected to a first-wiring of the plurality of first-wirings, and another end of the at least the part of the plurality of second-wirings is electrically connected to a first data line of the plurality of first data lines; and the plurality of second-wirings include a plurality of first sub-second-wirings and a plurality of second sub-second-wirings; one end of at least a part of the plurality of first sub-second-wirings and one end of at least a part of the plurality of second sub-second-wirings are both electrically connected to a same first-wiring; another end of the at least the part of the plurality of first sub-second-wirings is electrically connected to the first sub-data-line; and another end of the at least the part of the plurality of second sub-second-wirings is electrically connected to the second sub-data-line in the same second data line corresponding to the first sub-data-line.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
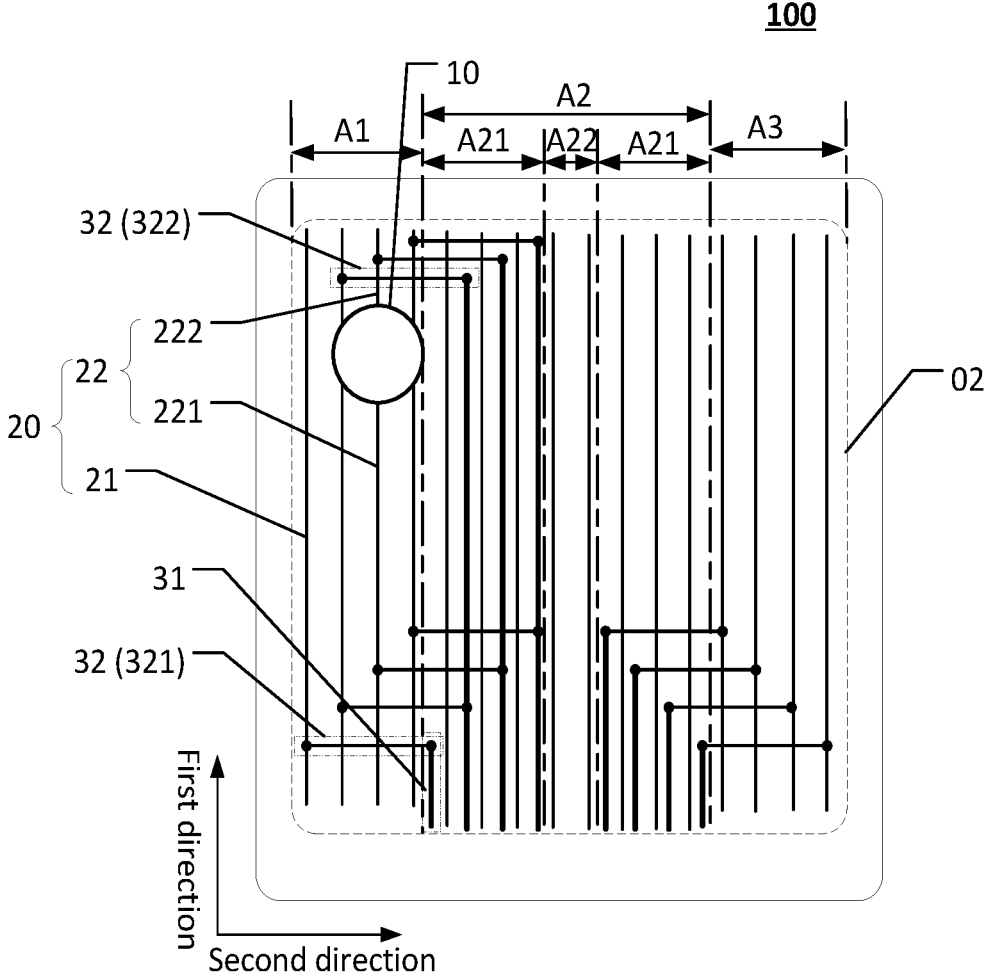
FIG. 1 illustrates a schematic of a display panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be regarded as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters are configured to indicate similar items in following drawings. Therefore, once an item is defined in one drawing, it does not need to be further discussed in subsequent drawings.

In the existing technology, on the basis that display apparatuses become thinner and lighter, users have higher and higher requirements for the screen-to-body ratios of display apparatuses. Therefore, in the development of current display apparatuses, expanding the display regions of the display apparatuses may become more crucial.

The present disclosure provides a display panel and a display apparatus for improving the screen-to-body ratios of the display apparatuses.

FIG. 1 illustrates a schematic of a display panel according to various embodiments of the present disclosure. Referring to FIG. 1, the present disclosure provides a display panel 100 which may include a display region 02 and at least one functional device configuration region 10. The display region 02 may at least partially surround the functional device configuration region 10.

The display panel 100 may further include a plurality of data lines 20 which extends along the first direction and is arranged along the second direction. The plurality of data lines 20 may include a plurality of first data lines 21 and a plurality of second data lines 22, where the second data line 22 may include the first sub-data-line 221 and the second sub-data-line 222. Along the first direction, the first sub-data-line 221 and the second sub-data-line 222 in a same second data line 22 may be respectively disposed on two sides of the functional device configuration region 10.

The display panel 100 may further include a plurality of first-wirings 31 extending along the first direction, and a plurality of second-wirings 32 extending along the second direction, where for at least a part of the second-wirings 32, one end of the second-wirings 32 may be electrically connected to the first-wiring 31, and another end of the second-wiring 32 may be electrically connected to the first data line 21.

The second-wiring 32 may include the first sub-second-wiring 321 and the second sub-second-wiring 322. Each of at least one end of a part of the first sub-second-wirings 321 and at least one end of a part of the second sub-second-wirings 322 may be electrically connected to a same first-wiring 31; another end of the first sub-second-wiring 321 may be electrically connected to the first sub-data-line 221; and another end of the second sub-second-wiring 322 may be electrically connected to the second sub-data-line 222 in a same second data line 22 corresponding to the first sub-data-line 221.

For example, the present disclosure provides a display panel 100. The display panel 100 may include the display region 02 and at least one functional device configuration region 10 which may be disposed to be surrounded by the display region 02; and the display panel 100 may further include the plurality of data lines 20 which extends along the first direction and is arranged along the second direction.

Based on the functional device configuration region 10 included in the display panel 100 provided by the present disclosure, the types of the data lines 20 may be divided into two categories, for example, the first data lines 21 and the second data lines 22. The first data line 21 may be the data line 20 extending along the first direction in the display panel 100 and having no disconnected position; and the second data line 22 may be the data line 20 extending along the first direction but having a disconnected position. For example, the second data line 22 may include the first sub-data-line 221 and the second sub-data-line 222; and along the first direction, the first sub-data-line 221 and the second sub-data-line 222 included in a same second data line 22 may be arranged on two sides of the functional device configuration region 10. That is, the difference between the first data line 21 and the second data line 22 is that each second data line 22 may be on two sides of the functional device configuration region 10 and formed by two sections (the first sub-data-line 221 and the second sub-data-line 222).

Based on the display panel 100 including the functional device configuration region 10 surrounded by the display region 02, the present disclosure may provide an optional manner for designing the wiring structure in the display panel 100 on how the data lines 20 disposed in the wiring structure receive drive signals. For example, a plurality of combined connection lines of the first-wirings 31 and the second-wirings 32 in the display panel 100 may be added, where the first-wirings 31 may extend along the first direction, and the second-wirings 32 may extend along the second direction.

In one embodiment, the second-wiring 32 may be configured to include the first sub-second-wiring 321 and the second sub-second-wiring 322. At this point, the first-wiring 31 to be electrically connected to the second-wiring 32 may be electrically connected to the first sub-second-wiring 321 and the second sub-second-wiring 322 at two positions, respectively. These two positions may be respectively on two sides of the functional device configuration region 10. Furthermore, another end of the first sub-second-wiring 321 may be configured to be electrically connected to the first sub-data-line 221 of one second data line 22, and another end of the second sub-second-wiring 322 may be configured to be electrically connected to the second sub-data-line 222 of a same second data line 22. That is, electrical signals may be transmitted to the second data line 22, connected to the first-wiring 31 and the second-wiring 32, through the first-wiring 31 and the second-wiring 32, and corresponding electrical signals may not be directly received through second data line 22. One end of the first-wiring 31 may be directly electrically connected to the components in the lower frame, which may realize that the electrical signals sent by the components may be transmitted to the first sub-data-line 221 through the first-wiring 31 and the first sub-second-wiring 321, and the electrical signals may be transmitted to the second sub-data-line 222 through the first-wiring 31 and the second sub-second-wiring 322.

In the present disclosure, the quantity of data lines 20 that directly receive electrical signals through above-mentioned wiring configuration may be reduced. At least a part of the data lines 20 may be to transmit electrical signals through added first-wirings 31 and second lines 32. Compared with the data line 20 that is electrically connected to the first-wiring 31 added, the configuration location of added first-wiring 31 in the display region 02 may be changed. For example, the first-wiring 31 may be configured in the middle region of the display region 02 to avoid the wiring space occupied by the data line 20 at the edge when being electrically connected with the components in the lower frame. Therefore, the effect of reducing the lower frame of the display panel 100 may be achieved, and the screen-to-body ratio of the display panel 100 may be increased.

It should be noted that it is possible that some first data lines 21 disposed at the edge of the display region 02 may also realize the transmission of electrical signals through the first-wiring 31 and the second line 32. For example, the first data line 21 adjacent to the left edge of the display region 02 in FIG. 1 may be electrically connected to the components in the lower frame through the first-wiring 31 and the second line 32, such that it realizes that the electrical signals sent from the components may be transmitted to the first data line 21 through the first-wiring 31 and the second-wiring 32. In such way, it may also avoid the problem of the wiring space occupied by the data line 20 located at the edge when being electrically connected to the components in the lower frame. Therefore, the effect of reducing the lower frame of the display panel 100 may be achieved, and the screen-to-body ratio of the display panel 100 may be increased.

Referring to FIG. 1, optionally, the display region 02 may include the first region A1, the second region A2 and the third region A3 which are arranged in sequence along the second direction; and the second region A2 may be between the first region A1 and the third region A3.

The second region A2 may include the first sub-second-region A21 and the second sub-second-region A22; and along the second direction, the first sub-second-regions A21 may be symmetrically arranged on two sides of the second sub-second-region A22.

The plurality of data lines 20 in the first region A1 may be all electrically connected to the second-wirings 32.

The first-wirings 31 may be all in the first sub-second-region A21, and the first sub-second-region A21 may further include a plurality of data lines 20.

The second sub-second-region A22 may include a plurality of data lines 20.

The plurality of data lines 20 included in the third region A3 may be all electrically connected to the second-wirings 32.

For example, for the convenience of describing the technical solutions of the present disclosure, the display region 02 of the display panel 100 in the present disclosure may be divided into three regions, for example, the first region A1, the second region A2 and the third region A3 which are sequentially arranged along the second direction. The second region A2 between the first region A1 and the third region A3 may be further divided into two first sub-second-regions A21 and one second sub-second-region A22. Along the second direction, two first sub-second-regions A21 may be symmetrically arranged on two sides of the second sub-second-region A22.

In an optional embodiment provided by the present disclosure, the plurality of data lines 20 in the first region A1 may be electrically connected to the second-wirings 32, that is, the data lines 20 in the first region A1 may all realize the transmission of electrical signals through the first-wirings 31 and the second-wirings 32 which are additionally disposed; and the plurality of data lines 20 in the third region A3 may also be electrically connected to the second-wirings 32, that is, the data lines 20 in the third region A3 may all realize the transmission of electrical signals through the first-wirings 31 and the second-wirings 32 which are additionally disposed. On such basis, it may configure that the first-wirings 31 may be all in the first sub-second-region A21. For example, the plurality of data lines 20 in the first region A1 may be electrically connected to the first-wirings 31 in the first sub-second-region A21, on the side of the second sub-second-region A22 adjacent to the first region A1, through the second-wirings 32; and the plurality of data lines 20 in the third region A3 may be electrically connected to the first-wirings 31 in the first sub-second-region A21, on the side of the second sub-second-region A22 adjacent to the third region A3, through the second-wirings 32. It is equivalent to that in the present disclosure, the data lines 20 in the edge regions (the first region A1 and the third region A3) in the display region 02 may be led to the center region (the second region A2) through the first-wirings 31 and the second-wirings 32. In such way, the data lines 20 in the display region 02 that were originally in the edge regions may be electrically connected to the components in the lower frame through the central region of the display region 02. Such configuration may reduce the wiring space that needs to be occupied when the data lines 20 are electrically connected to the components in the lower frame, for example, the wiring space of the R corner (i.e., rounded corner) region corresponding to the lower frame of the display panel 100. Therefore, the wirings width required by the non-display region 01 in the lower frame may be reduced, which may achieve the effect of reducing the lower frame of the display panel 100 and increase the screen-to-body ratio of the display panel 100.

It should be noted that the second region A2 may also include the data lines 20. For example, the first sub-second-region A21 may include both the data lines 20 and the first-wirings 31, and the second sub-second-region A22 may only include the data lines 20 and may not include the first-wirings 31. The second sub-second-region A22 may include only one data line 20, or may include multiple data lines 20, which may not be limited in the present application. The user may adjust the proportion of the second sub-second-region A22 in the second region A2 according to the space required for disposing the first-wirings 31, such that the quantity of data lines 20 included in the second sub-second-region A22 may be adaptively adjusted.

It should also be noted that, when the first-wirings 31 and the data lines 20 extending along the first direction are disposed in the first sub-second-region A21 simultaneously, one first-wiring 31 may be optionally disposed between two adjacent data lines 20, which may not be limited in the present disclosure. The user may also adjust the quantity of the first-wirings 31 included between two adjacent data lines 20 according to requirements. In addition, optionally, it may also configure that first-wirings 31 may be between some data lines 20, and first-wirings 31 may not be between some other data lines 20.

It should also be noted that FIG. 1 only illustrates description of various technical solutions provided in the present application and may not limit the shape, the quantity of data lines 20 in the display region 02, the size and shape of the functional device configuration region 10 and the like; and the user may adjust the internal structure of the display panel 100 according to requirements.

It should also be noted that the upper side of the first-wirings 31 shown in FIG. 1 may be further provided with floating first-wirings 31 to uniformly display the reflectivity of the panel 100 and avoid uneven display pictures of the display panel 100.

Figure 2:
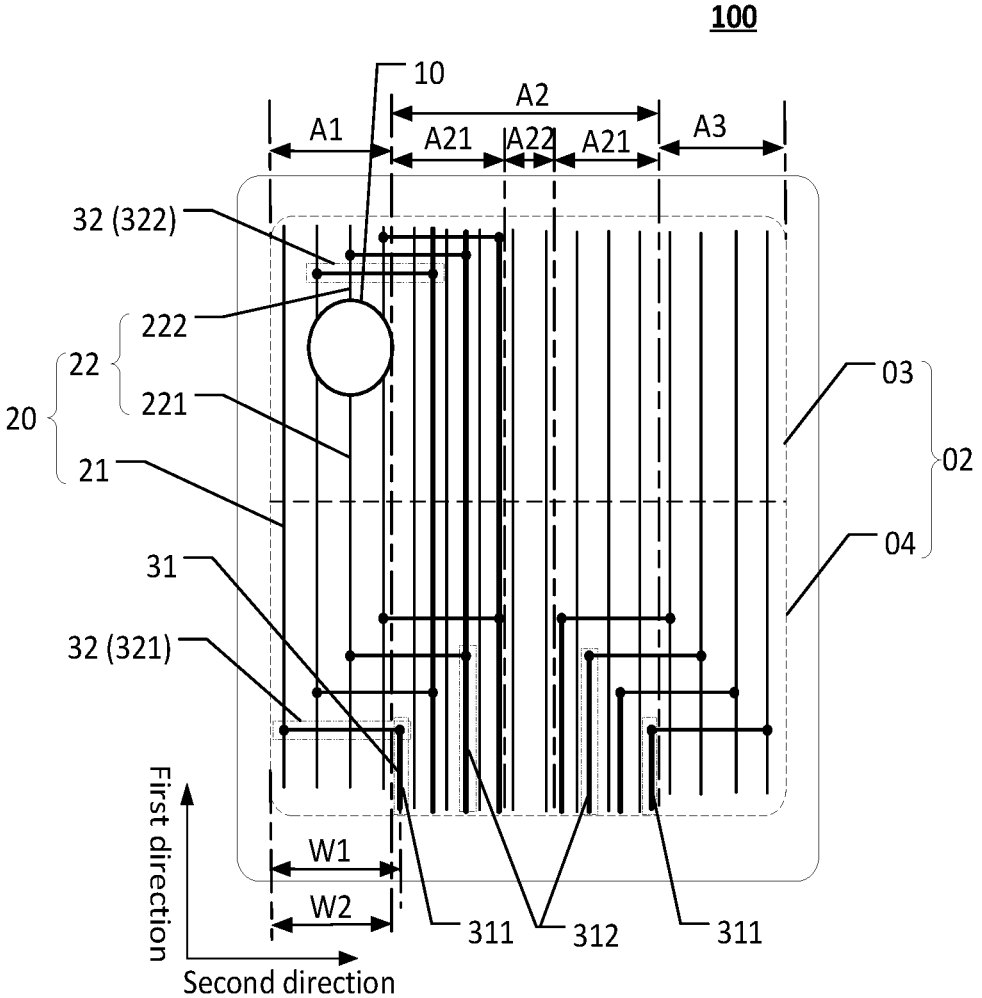
FIG. 2 illustrates another schematic of a display panel according to various embodiments of the present disclosure.

FIG. 2 illustrates another schematic of a display panel according to various embodiments of the present disclosure. Referring to FIG. 2, optionally, the display region 02 may include the first display region 03 and the second display region 04 which care arranged along the first direction; the first display region 03 may include the functional device configuration region 10.

In the second display region 04, the quantity of data lines 20 in the first region A1 is D1; and the quantity of the first-wirings 31 in the first sub-second-region A21 between the second sub-second-region A22 and the first region A1 is D2, where D1:D2=1.

For example, the display panel 100 provided by the present disclosure may include the functional device configuration region 10; and the display region 02 provided by the present application may be divided into the first display region 03 and the second display region 04 which are arranged along the first direction. The functional device configuration region 10 may only be configured in the first display region 03. That is, no functional device configuration region 10 may be in the second display region 04; and the second display region 04 may only be one picture display region 02.

At this point, in an optional embodiment of the present disclosure, the quantity of data lines 20 in the first region A1 in the second display region 04 may be same as the quantity of the first-wirings 31 in the first sub-second-region A21 on the side of the second sub-second-region A22 adjacent to the first region A1. Similarly, in the second display region 04, it may further configure that the quantity of the data lines 20 in the third region A3 may be same as the quantity of the first-wirings 31 in the first sub-second-region A21 on the side of the second sub-second-region A22 adjacent to the third region A3.

In the second display region 04 of the present disclosure, the quantity of data lines 20 that need to transmit electrical signals through the first-wirings 31 and the second-wirings 32 may be configured to be same as the quantity of the first-wirings 31, which realizes that along the second direction, all the data lines 20 in the display panel 100 arranged on the edge of the display region 02 may be electrically connected to the components in the lower frame through the central region of the display region 02 by means of the first-wirings 31 and the second-wirings 32. Such configuration may reduce the wiring space that needs to be occupied when the data lines 20 are electrically connected to the components in the lower frame, for example, the wiring space of the R corner region corresponding to the lower frame of the display panel 100. Therefore, the wirings width required by the non-display region 01 in the lower frame may be reduced, which may achieve the effect of reducing the lower frame of the display panel 100 and increase the screen-to-body ratio of the display panel 100.

Figure 3:
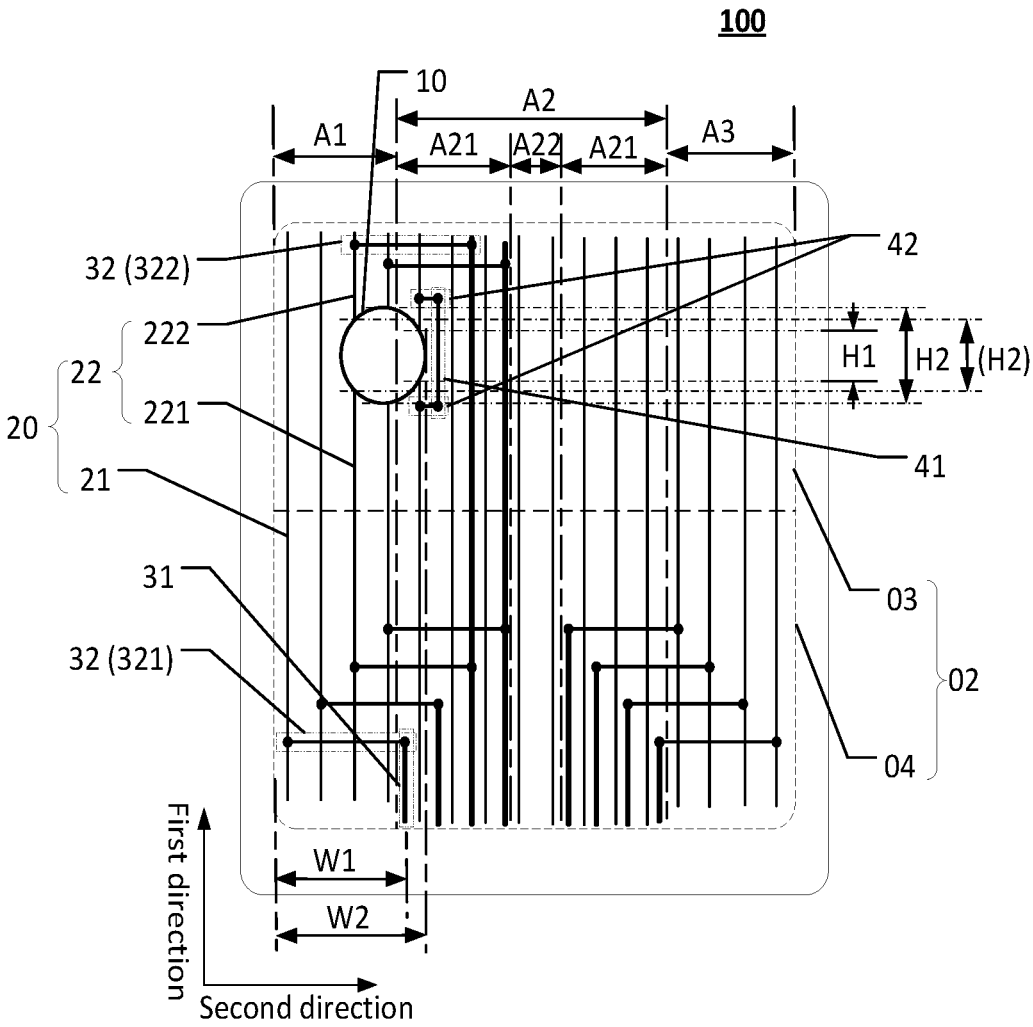
FIG. 3 illustrates another schematic of a display panel according to various embodiments of the present disclosure.

FIG. 3 illustrates another schematic of a display panel according to various embodiments of the present disclosure. Referring to FIGS. 2 and 3, optionally, the display region 02 may include the first display region 03 and the second display region 04 which are arranged along the first direction; and the first display region 03 may include the functional device configuration region 10.

In the first display region 03, the quantity of data lines 20 passing the functional device configuration region 10 is D3; and the quantity of the first-wirings 31 in the first sub-second-region A21 between the second sub-second-region A22 and the first region A1 is D4, where For example, the display panel 100 provided by the present disclosure may include the functional device configuration region 10. The display region 02 provided by the present application may be divided into the first display region 03 and the second display region 04 arranged along the first direction. The functional device configuration region 10 may only be configured in the first display region 03. That is, no functional device configuration region 10 may be in the second display region 04; and the second display region 04 may only be one picture display region 02.

At this point, in an optional embodiment of the present disclosure, as shown in FIG. 2, in the first display region 03, the quantity of data lines 20 that need to pass the functional device configuration region 10 may be configured to be same as the quantity of the first-wirings 31 in the first sub-second-region A21 between the second sub-second-region A22 and the first region A1, where the quantities may be both 3. As shown in FIG. 3, the quantity (3) of data lines 20 that need to pass the functional device configuration region 10 may be also configured to be greater than the quantity (2) of the first-wirings 31 in the first sub-second-region A21 between the second sub-second-region A22 and the first region A1. The data line 20 passing the functional device configuration region 10 may be the data line 20 that needs to be disconnected in the functional device configuration region 10, that is, above-mentioned second data line 22 may include the first sub-data-line 221 and the second sub-data-line 222.

When the quantity of data lines 20 that need to pass the functional device configuration region 10 is greater than the quantity of first-wirings 31 in the first sub-second-region A21 between the second sub-second-region A22 and the first region A1, at least one second data line 22 may not meet the demand of required electrical signals. At this point, the first sub-data-line 221 and the second sub-data-line 222 may be connected through other connection lines, so that each second data line 22 may receive required electrical signals. The present disclosure may not limit the configuration of the connection lines that electrically connect the first sub-data-lines 221 and the second sub-data-lines 222 in the second data lines 22. The user may adjust the configuration of film layers and wiring manners according to actual design of the display panel 100, as long as the first sub-data-lines 221 and the second sub-data-lines 222 are connected to each other.

Referring to FIGS. 2 and 3, optionally, the display region 02 may include the first display region 03 and the second display region 04 which are arranged along the first direction; and the first display region 03 may include the functional device configuration region 10.

In the first display region 03, the quantity of the first-wirings 31 in the first sub-second-region A21 between the second sub-second-region A22 and the first region A1 is D4; and in the second display region 04, the quantity of the first-wirings 31 in the first sub-second-region A21 between the second sub-second-region A22 and the first region A1 is D2, where D4<D2.

For example, the display panel 100 provided by the present disclosure may include the functional device configuration region 10. The display region 02 provided by the present disclosure may be divided into the first display region 03 and the second display region 04 arranged along the first direction. The functional device configuration region 10 may only be configured in the first display region 03. That is, no functional device configuration region 10 may be in the second display region 04; and the second display region 04 may only be one picture display region 02.

In an optional embodiment of the present disclosure, in the first display region 03, the quantity of first-wirings 31 in the first sub-second-region A21 between the second sub-second-region A22 and the first region A1 (the quantity of 3 shown in FIG. 2 and the quantity of 2 shown in FIG. 3) may be less than the quantity of first-wirings 31 in the first sub-second-region A21 between the second sub-second-region A22 and the first region A1 in the second display region 04 (the quantity of 4 shown in FIGS. 2-3). That is, the quantity of the first-wirings 31 in the first display region 03 on the side of the functional device configuration region 10 may be configured to be less than the quantity of the first-wirings 31 in the second display region 04 on the side without the functional device configuration region 10.

For example, all the data lines 20 disposed in the first region A1 may receive electrical signals through being electrically connected to the first-wirings 31 and the second-wiring 32. For example, in the second display region 04 that is not disposed with the functional device configuration region 10, the quantity of the first-wirings 31 in the first sub-second-region A21 and the quantity of the data lines 20 in the first region A1 may be configured in a one-to-one correspondence. In addition, in the first display region 03 where the functional device configuration region 10 is disposed, a part of data lines 20 may include two segments, that is, include the first sub-data-line 221 and the second sub-data-line 222; and a part of data lines 20 may include one segment extending to the second display region 04. The data line 20 (the first data line 21) configured as one segment may be electrically connected to the first-wiring 31 through the second line 32 in the second display region 04, which may realize the transmission requirement of the electrical signals of entire first data line 21 across the first display region 03 and the second display region 04. Therefore, in the first display region 03, the first sub-data-lines 221 and the second sub-data-lines 222 which are disposed on two sides of the functional device configuration region 10 and included in a part of the second data lines 22 may need to be electrically connected to the first-wrings 31. That is, only a part of the second-wirings 32 (the second data wires 22) may need to be correspondingly disposed with the first-wirings 31 in both the first display region 03 and the second display region 04.

Based on above-mentioned description, in the present disclosure, the quantity of the first-wirings 31 in the first display region 03 may be configured to be less than the quantity of the first-wirings 31 in the second display region 04, which may not only satisfy the transmission of electrical signals required by the data lines 20 in the first region A1, but also avoid the problem that the extension length of each first-wiring 31 is excessively long. Therefore, wiring complexity in the display panel 100 may be reduced, the fabrication cost of the display panel 100 may be also reduced, and normal operation of the display panel 100 may be also ensured.

Referring to FIG. 2, optionally, the width of the first region A1 along the second direction is W1. W1 may be the distance between the edge of the first region A1, on the side away from the second region A2, and the first-wiring 31 which has the largest distance from the second sub-second-region A22 in the plurality of first-wirings 31 in the first sub-second-region A21 between the second sub-second-region A22 and the first region A1. The maximum distance between the edge of the first region A1 on the side away from the second region A2 and the edge of the functional device configuration region 10 on the side adjacent to the second sub-second-region A22 is W2.

When W2<W1, the first sub-data-line 221 and the second sub-data-line 222 of each second data line 22 may be electrically connected to a same first-wiring 31.

For example, it is equivalent to that, taking the edge of one side (the right side as shown in FIG. 2) of the display region 02 as an example, the distance between the edge and the first first-wiring 31 adjacent to the edge may be W1; and when the display panel 100 is disposed with the functional device configuration region 10, the maximum distance between such edge to an edge which is on the side adjacent to the functional device configuration region 10 and adjacent to the center of the display region 02 may be W2. When W2<W1 is configured, that is, the functional device configuration region 10 may be between edge and the first first-wiring 31 adjacent to the edge.

Based on above-mentioned structural configuration manner of the display panel 100, in an optional configuration manner of the present disclosure, for all second data lines 22 passing the functional device configuration region 10, the first sub-data-line 221 and the second sub-data-line 222 included in each second data line 22 may be electrically connected to a same first-wiring 31. That is, along the first direction, at this point, the first sub-data-line 221 and the second sub-data-line 222 included in each second data line 22 may be electrically connected to the first sub-second-wiring 321 and the second sub-second-wiring 322 which are correspondingly disposed, and further electrically connected to one first-wiring 31. Therefore, each second data line 22 passing the functional device configuration region 10 may receive the electrical signals transmitted through a same first-wiring 31, which may be beneficial for make the display effect of the display panel 100 more stable and desirable.

Referring to FIG. 3, optionally, the width of the first region A1 along the second direction is W1. W1 may be the distance between the edge of the first region A1, on the side away from the second region A2, and the first-wiring 31 which has the largest distance from the second sub-second-region A22 in the plurality of first-wirings 31 in the first sub-second-region A21 between the second sub-second-region A22 and the first region A1. The maximum distance between the edge of the first region A1 on the side away from the second region A2 and the edge of the functional device configuration region 10 on the side adjacent to the second sub-second-region A22 is W2.

When W2>W1, the first sub-data-line 221 and the second sub-data-line 222 of at least one second data line 22 in the first region A1 may be electrically connected to a same first-wiring 31; and the first sub-data-line 221 and the second sub-data-line 222 of at least one second data line 22 may be electrically connected through the first connection line 41 and the second connection line 42.

The first connection line 41 may extend along the first direction, and the second connection line 42 may extend along the second direction.

For example, it is equivalent to that, taking the edge of one side (the right side as shown in FIG. 2) of the display region 02 as an example, the distance between the edge and the first first-wiring 31 adjacent to the edge is W1. For example, when the display panel 100 is disposed with the functional device configuration region 10, the maximum distance between such edge to an edge which is on the side adjacent to the functional device configuration region 10 and adjacent to the center of the display region 02 may be W2. When W2>W1 is configured, that is, when the first first-wiring 31 adjacent to the edge extends toward the functional device configuration region 10 along the first direction, the first first-wiring 31 may pass the functional device configuration region 10. In an optional configuration manner provided by the present disclosure, the wiring manner of a part of the second data lines 22 may be configured as that the first sub-data-lines 221 and the second sub-data-lines 222 included therein may be all electrically connected to a same first-wiring 31. A wiring manner of another part of the second data lines 22 may be that the first sub-data-lines 221 and the second sub-data-lines 222 included therein may be electrically connected with each other through other wirings. For example, one first connection line 41 and two second connection lines 42 may be added to each second data line 22 to achieve electrical connection. One end of the second connection line 42 (the second connection line 42 on the lower side of the functional device configuration region 10 in FIG. 3) may be electrically connected to the first end of the first connection line 41, and another end of the second connection line 42 may be electrically connected to the first sub-data-line 221. One end of another second connection line 42 (the second connection line 42 on the upper side of the functional device configuration region 10 in FIG. 3) may be electrically connected to the second end of the first connection line 41 and another end of another second connection line 42 may be electrically connected to the second sub-data-line 222. In such way, the electrical connection between the first sub-data-line 221 and the second sub-data-line 222 in a same second data line 22 on two sides of the functional device configuration region 10 may be realized, which may ensure the stability of the electrical signals received by each of the second data lines 22 and be beneficial for that the display effect of the display panel 100 is more stable and desirable. Referring to FIG. 3, optionally, along the first direction, the first distance H1 may be between the first sub-data-line 221 and the second sub-data-line 222 which are electrically connected by the first connection line 41 and the second connection line 42; and the second distance H2/(H2) may be between the first sub-second-wiring 321 and the second sub-second-wiring 322 which are electrically connected to a same first-wiring 31.

Figure 4:
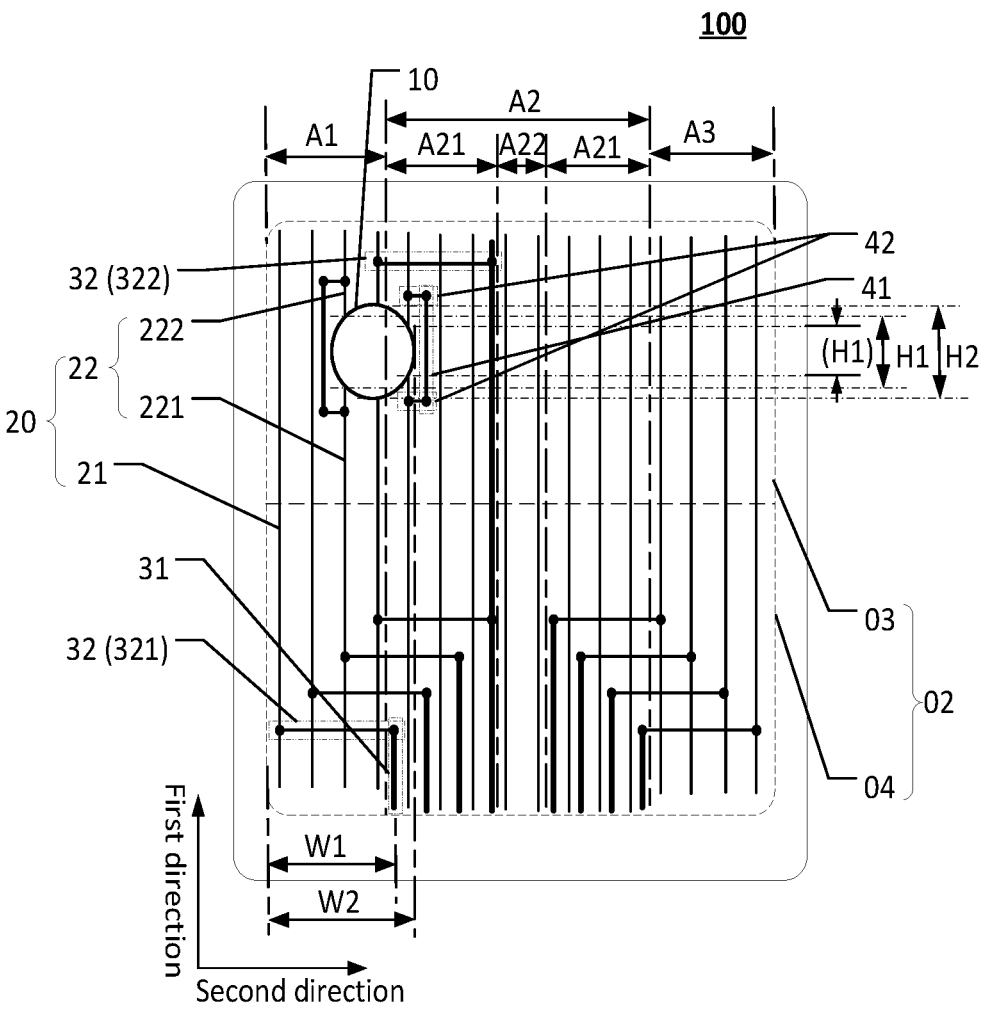
FIG. 4 illustrates another schematic of a display panel according to various embodiments of the present disclosure.

FIG. 4 illustrates another schematic of a display panel according to various embodiments of the present disclosure. Referring to FIG. 4, optionally, along the first direction, the first distance H1/(H1) may be between the first sub-data-line 221 and the second sub-data-line 222 which are electrically connected by the first connection line 41 and the second connection line 42; and the second distance H2 may be between the first sub-second-wiring 321 and the second sub-second-wiring 322 which are electrically connected to a same first-wiring 31, where H2>H1.

For example, when W2>W1 and at least one second data line 22 is electrically connected through above-mentioned first connection line 41 and second connection line 42, and when the second data lines 22 is electrically connected to a same first-wiring 31 through two second lines 32, the present disclosure provides an optional configuration manner that the data line 20 electrically connected through the first connection line 41 and the second connection line 42 may be configured to be disposed, along the second direction, in an region that needs to pass the functional device configuration region 10 and on the side of at least one edge adjacent to the functional device configuration region 10. That is, the discontinuous distance included in the data line 20 disposed passing the functional device configuration region 10 and adjacent to the edge of the functional device configuration region 10 may be relatively small and the discontinuous distance may be H1. However, the discontinuous distance included in the data lines 20 disposed passing the central region of the functional device configuration region 10 and adjacent to the central region may be relatively large, and the discontinuous distance may be H2.

In such configuration, by adding the first-wirings 31, the second-wirings 32, the first connection lines 41 and the second connection lines 42, it realizes that along the second direction in the display panel 100, all data lines 20 disposed on the edge of the display region 02 may be electrically connected to the components in the lower frame through the central region of the display region 02 by means of the first-wirings 31 and the second-wirings 32. Such configuration may reduce the wiring space that needs to be occupied when the data lines 20 are electrically connected to the components in the lower frame, for example, the wiring space of the R corner region corresponding to the lower frame of the display panel 100. Therefore, the wirings width required by the non-display region 01 in the lower frame may be reduced, which may achieve the effect of reducing the lower frame of the display panel 100 and increase the screen-to-body ratio of the display panel 100.

Referring to FIG. 3, optionally, the second data line 22 electrically connected by the first connection line 41 and the second connection line 42 may be only in the second region A2.

For example, when W2>W1 and at least one second data line 22 is electrically connected through above-mentioned first connection line 41 and second connection line 42, and when the second data lines 22 is electrically connected to a same first-wiring 31 through two second lines 32, the present disclosure provides an optional configuration manner that the second data line 22 electrically connected by the first connection line 41 and the second connection line 42 may only be on the side of the first-wiring 31 that is closest to the edge of the display region 02 adjacent to the functional device configuration region 10 and is adjacent to the center of the display region 02. That is, the second data line 22 electrically connected by the first connection line 41 and the second connection line 42 may be disposed only on the side of the functional device configuration region 10 adjacent to the center of the display region 02.

In such configuration, the electrical connection between the first sub-data-line 221 and the second sub-data-line 222 included in the second data line 22 may be realized; and added first-wiring 31, added second-wiring 32, the first connection line 41 and the second connection line 42 may all be in the second region A2 along the second direction. During the fabrication process, the printing of additional wirings may be concentrated in the display region 02 of the display panel 100, thereby reducing the complexity of fabrication the display panel.

Referring to FIG. 4, the second data line 22 may be electrically connected by the first connection line 41 and the second connection line 42. Optionally, along the second direction, the second data lines 22 electrically connected to the first connection line 41 and the second connection line 42 may be disposed on two sides of the second data line 22 electrically connected to a same first-wiring 31.

For example, when W2>W1 and at least one second data line 22 is electrically connected through above-mentioned first connection line 41 and second connection line 42, and when the second data lines 22 is electrically connected to a same first-wiring 31 through two second lines 32, the present disclosure provides an optional configuration manner that the second data line 22 electrically connected by the first connection line 41 and the second connection line 42 may be located outside the side of the first-wiring 31 that is closest to the edge of the display region 02 adjacent to the functional device configuration region 10 and is adjacent to the center of the display region 02. It can also be configured that the second data line 22 electrically connected through the first connection line 41 and the second connection line 42 may also pass the center point in the functional device configuration region 10 and on the side away from the center point of the display region 02. That is, along the second direction, two sides of the center point region in the functional device configuration region 10 may include the second data lines 22 that need to be electrically connected through the first connection lines 41 and the second connection lines 42.

In the present disclosure, the second data lines 22 electrically connected with the first connection line 41 and the second connection line 42 may be disposed on two sides of the second data line 22 electrically connected to a same first-wiring 31. In such way, the distance H2 between the first sub-data-line 221 and the second sub-data-line 222 included in the second data line 22 electrically connected to a same first-wiring 31 may be larger. Such distance may be greater than the distance H1 between the first sub-data-line 221 and the second sub-data-line 222 included in the second data line 22 electrically connected to the first connection line 41 and the second connection line 42. Therefore, the first sub-data-line 221 and the second sub-data-line 222 with a smaller distance may be electrically connected through the first connection line 41 and the second connection line 42, and the electrical signals received by such second data line 22 may be sequentially transmitted from bottom to top. The second data line 22 may be electrically connected a same first-wiring 31. The first-wiring 31 may transmit electrical signals to the first sub-data-line 221 through the first sub-second-wiring 321; and the first-wiring 31 may simultaneously transmit electrical signals to an upper side. Therefore, the time difference between the first sub-data-line 221 and the second sub-data-line 222 included in the second data line 22 electrically connected to a same first-wiring 31 for receiving electrical signals may be shortened.

That is, through above-mentioned configuration, when the distance between the first sub-data-line 221 and the second sub-data-line 222 included in the second data line 22 is relatively small, the electrical signals may be transmitted sequentially from bottom to top; and if such distance is relatively large, the electrical signals may be transmitted upward when being transmitted to the first sub-data-line 221, such that the electrical signals may be transmitted to the second data line 222 as quick as possible. Such configuration may enable the data lines 20 on two sides of the functional device configuration region 10 to complete the transmission of electrical signals within almost same or even same time, which may improve the display stability of the display panel 100. In addition, the lengths of all wirings to be added along the first direction may be shortened to a certain extent, the complexity of wirings inside the display panel 100 may be reduced, and the fabrication process of the display panel 100 may be simplified.

Referring to FIGS. 3 and 4, optionally, the first connection line 41 and the data line 20 may be fabricated in a same layer using a same process, and the second connection line 42 and the data line 20 may be fabricated in different layers.

For example, in an optional embodiment of the present disclosure, the first connection lines 41 and the data lines 20 may all extend along the first direction. Therefore, in order to avoid the functional device configuration region 10 and avoid the influence of electrical signals generated by being electrically connected to other data lines 20, the first connection lines 41 may not occupy the region in the display region 02 where the data lines 20 were originally arranged. For example, the first connection line 41 may be arranged between two adjacent data lines 20. As disclosed above, the first connection line 41 and the data line 20 may be optionally configured to be made in a same layer using a same process, which may avoid the process increase of the display panel 100 caused by additional first connection line 41 and the fabrication cost increase of the display panel 100. In addition, since the second connection line 42 extends along the second direction, the extension direction of the second connection line 42 may intersect the extension direction of the data line 20. To avoid the contact between the second connection line 42 and the data line 20 and to avoid the influence of the second connection line 42 on the electrical signal of the data line 20, the second connection line 42 and the data line 20 may be fabricated in different layers. That is, an insulating layer may be included between the metal layer of the second connection line 42 and the metal layer of the data line 20, which may ensure the stability of the electrical signals received by each signal in the display panel 100 and improve the display effect of the display panel 100.

It should be noted that the present disclosure may not limit that the first connection line 41 must be fabricated as a same layer as the data line 20; and if the quantity of film layers and space are available, the first connection line 41, the second connection line 42 and the data line 20 may also be disposed in different layers. In addition, the present disclosure may not limit that all data lines 20 must be in a same metal layer. Similarly, the first connection lines 41 included in the display panel 100 may also be distributed in different metal layers, and the second connection lines 42 included in the display panel 100 may also be distributed in different metal layers. That is, the film layers corresponding to various types of wirings in the display panel 100 may be configured, and the user may make corresponding adjustments according to actual products, which may not be limited in the present disclosure.

Figure 5:
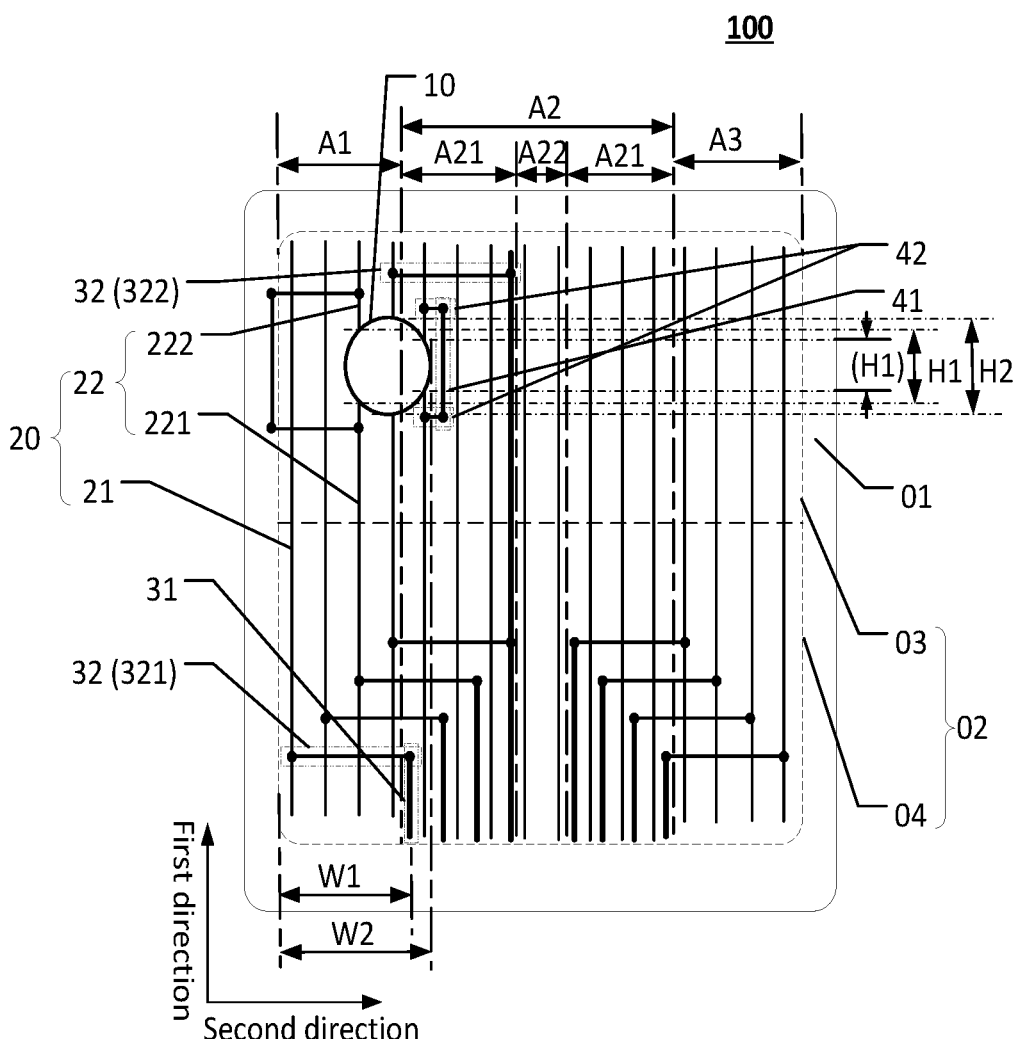
FIG. 5 illustrates another schematic of a display panel according to various embodiments of the present disclosure.
Figure 6:
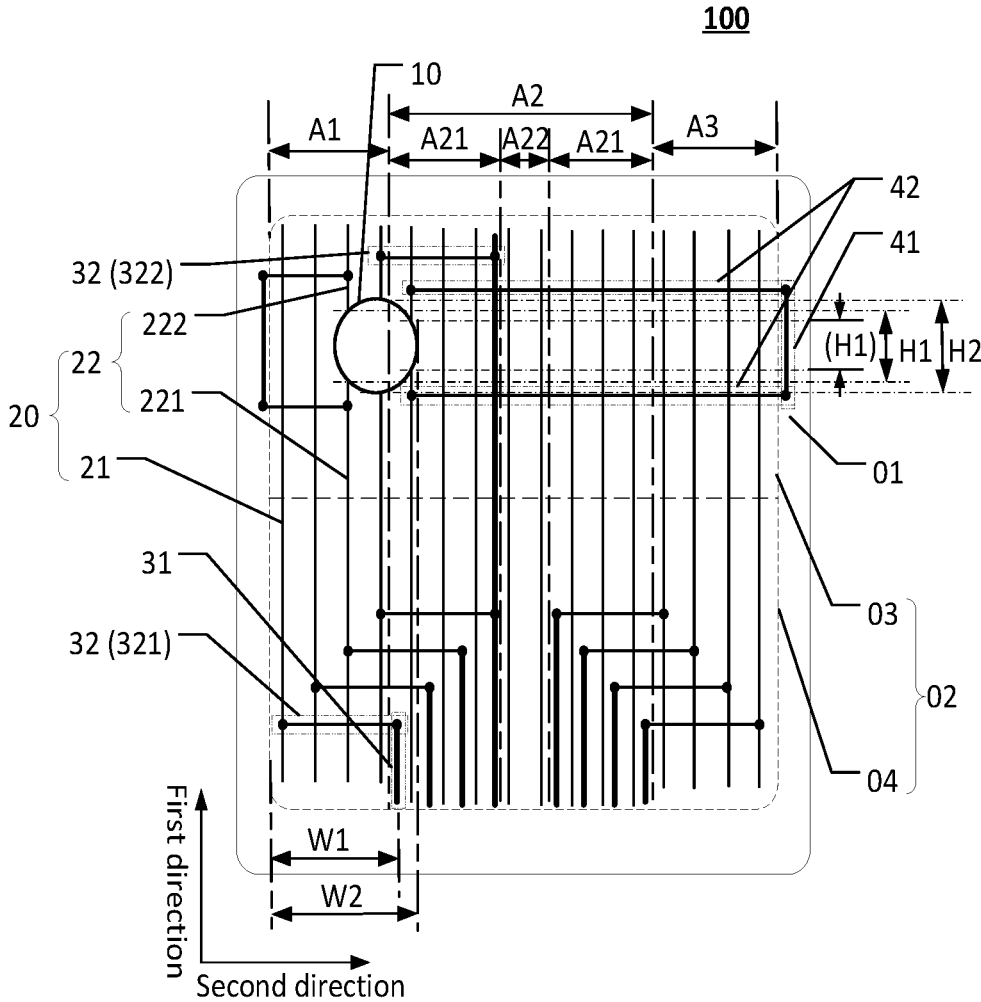
FIG. 6 illustrates another schematic of a display panel according to various embodiments of the present disclosure.

FIG. 5 illustrates another schematic of a display panel according to various embodiments of the present disclosure. FIG. 6 illustrates another schematic of a display panel according to various embodiments of the present disclosure. Referring to FIGS. 3-6, optionally, the display panel 100 may include the non-display region 01. The non-display region 01 may at least partially surround the display region 02.

At least one first connection line 41 may be in the non-display region 01.

For example, the display panel 100 provided by the present disclosure may further include the non-display region 01 on the basis of including the display region 02; and the non-display region 01 may be configured to surround the display region 02. When the display panel 100 is disposed with the first connection line 41 and the second connection line 42, the present disclosure may provide at least three optional configuration manners for the configuration region of the first connection line 41. For the first configuration manner, as shown in FIGS. 3 and 4, all first connection lines 41 may be in the display region 02. For the second configuration manner, as shown in FIG. 5, a part of the first connection lines 41 may be in the display region 02, and a part of the first connection lines 41 may be in the non-display region 01; and the first connection line 41 in the non-display region 01 shown in FIG. 5 may be in the non-display region 01 on the left side in FIG. 5. For the third configuration manner, as shown in FIG. 6, all first connection lines 41 may be in the non-display region 01.

When the first connection lines 41 added in the display panel 100 are at least partially disposed in the non-display region 01, the space occupation of the display region 02 by the first connection lines 41 may be reduced or avoided, and the drawback of additional wiring in the display region 02 on the display effect may also be avoided.

It should be noted that, for above-mentioned three configuration manners of the first connection lines 41 provided in the present disclosure, the user may make corresponding selections according to design requirements of actual products, which may not be limited in the present disclosure.

It should also be noted that two first connection lines 41 shown in FIG. 6 may be disposed on two sides (left and right sides) of the non-display region 01, which is only an optional embodiment provided by the present application. According to actual configuration structure of the display panel 100, the plurality of first connection lines 41 may be disposed in the non-display region 01 on the left side or on the right side, which may not be limited in the present disclosure.

Figure 7:
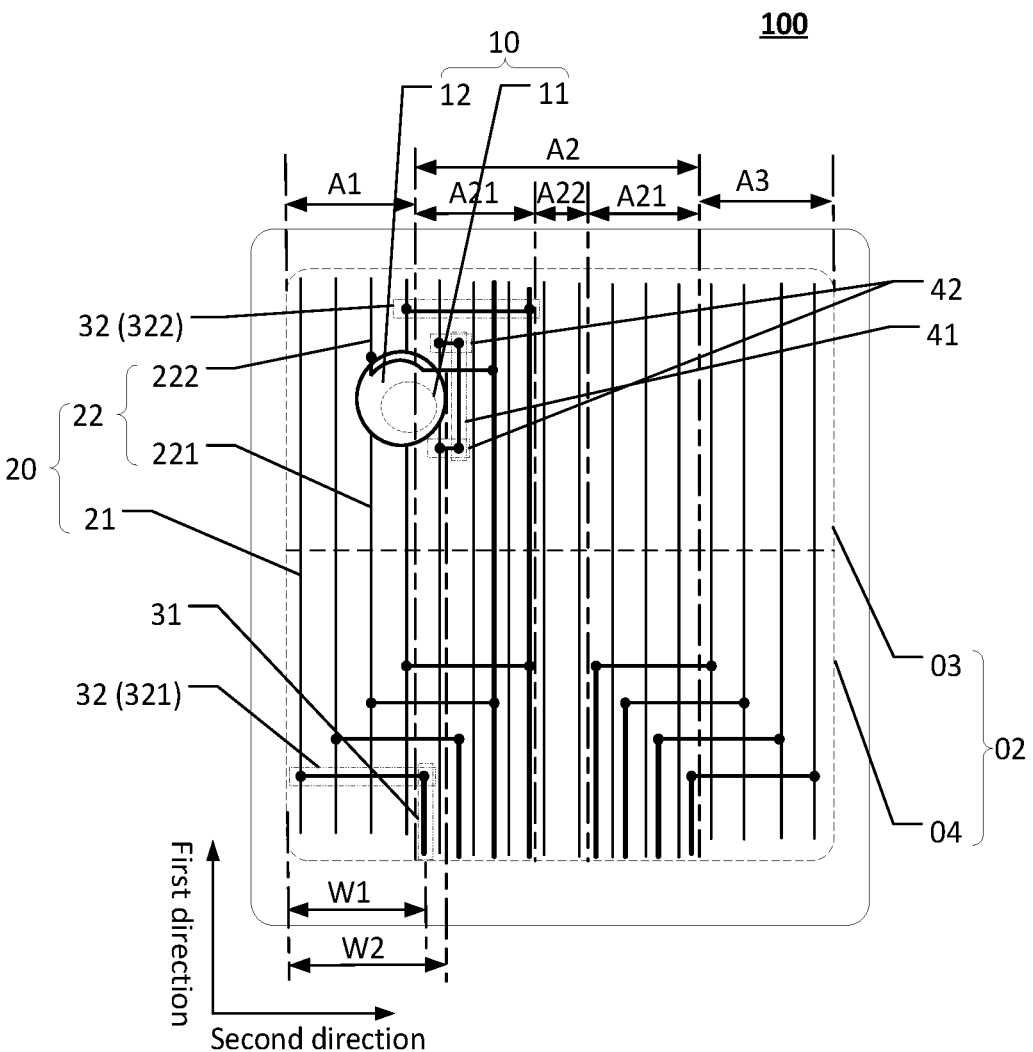
FIG. 7 illustrates another schematic of a display panel according to various embodiments of the present disclosure.

FIG. 7 illustrates another schematic of a display panel according to various embodiments of the present disclosure. Referring to FIG. 7, optionally, the functional device configuration region 10 may include a light-transmitting region 11 and a first non-display region 12 surrounding the light-transmitting region 11.

At least a part of the second sub-second-wiring 322 may be in the first non-display region 12, and the second sub-second-wiring 322 may be on the side of the light-transmitting region 11 away from the first sub-second-wiring 321.

For example, the functional device configuration region 10 provided by the present disclosure may be used for disposing cameras, photosensitive devices and the like. Therefore, a part of the functional device configuration region 10 may transmit light, and some component configuration regions to assist the use of related devices may be also included in the functional device configuration region 10. For example, the functional device configuration region 10 may be divided into the light-transmitting region 11 and the first non-display region 12; and the first non-display region 12 may be optionally configured to surround the light-transmitting region 11.

At this point, the present disclosure also provides an optional configuration manner that along the first direction, taking the non-display region 01 (the lower non-display region) where the components outputting electrical signals to the data lines 20 are located as an example, the second-wiring 32 on the side of the light-transmitting region 11 of the functional device configuration region 10 adjacent to the non-display region 01 (the lower non-display region) may be the first sub-second-wiring 321; and the second-wiring 32 on the side of the light-transmitting region 11 of the functional device configuration region 10 away from the non-display region 01 may be the second sub-second-wiring 322. At this point, at least a part of the second sub-second-wiring 322 may be optionally arranged to be wired through the first non-display region 12 and then electrically connected to corresponding second data line 22. Such configuration may reduce the occupation of the region of the display region 02 by added second sub-second-wirings 322, avoid the interference of additional wirings on other wirings in the display panel 100, and may be beneficial for ensuring the stability and yield of the display panel 100.

It should be noted that, taking current mainstream display panel including the functional device configuration region as an example, the quantity of wirings in corresponding first non-display regions on the left side and the upper side in the functional device configuration region may be relatively small, and there may be space for additional wirings. Therefore, the present disclosure provides an embodiment that as shown in FIG. 7, for example, a part of the second sub-second-wiring 322 may be wired through the upper side of the first non-display region 12, which may avoid space expansion of the first non-display region 12, avoid the influence of the space squeeze on remaining components in the region, and ensure the usage yield of entire display panel 100.

Figure 8:
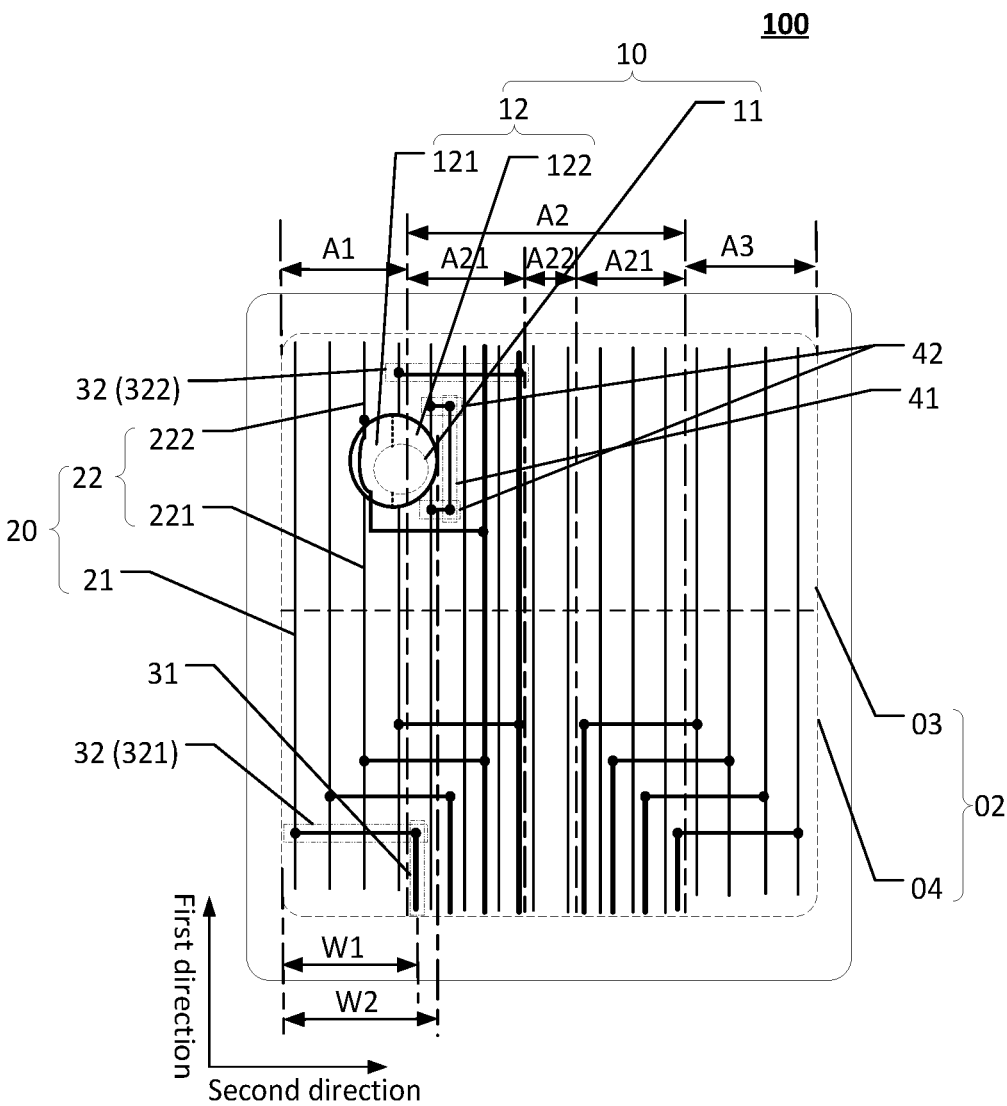
FIG. 8 illustrates another schematic of a display panel according to various embodiments of the present disclosure.

FIG. 8 illustrates another schematic of a display panel according to various embodiments of the present disclosure. Referring to FIG. 8, optionally, the functional device configuration region 10 may include the light-transmitting region 11 and the first non-display region 12 surrounding the light-transmitting region 11.

At least a part of the second sub-second-wirings 322 may be in the first non-display region 12, and the second sub-second-wiring 322 may be on the side of the light-transmitting region 11 adjacent to the first sub-second-wiring 321.

For example, the functional device configuration region 10 provided by the present disclosure may be used for disposing cameras, photosensitive devices and the like. Therefore, a part of the functional device configuration region 10 may transmit light, and some component configuration regions to assist the use of related devices may be also included in the functional device configuration region 10. For example, the functional device configuration region 10 may be divided into the light-transmitting region 11 and the first non-display region 12; and the first non-display region 12 may be optionally configured to surround the light-transmitting region 11.

At this point, the present disclosure also provides an optional configuration manner that along the first direction, taking the non-display region 01 (the lower non-display region) where the components outputting electrical signals to the data lines 20 are located as an example, the second-wiring 32 on the side of the light-transmitting region 11 of the functional device configuration region 10 adjacent to the non-display region 01 may be the first sub-second-wiring 321. The present disclosure provides an optional configuration manner that at least a part of the second sub-second-wiring 322 may be configured to be wired through the first non-display region 12 and then electrically connected to corresponding second data line 22. At this point, at least a part of the second sub-second-wiring 322 may be disposed between the light-transmitting region 11 and the first sub-second-wiring 321. Such configuration may reduce the occupation of the region of the display region 02 by added second sub-second-wirings 322, avoid the interference of additional wirings on other wirings in the display panel 100, and may be beneficial for ensuring the stability and yield of the display panel 100.

It should be noted that, taking current mainstream display panel including the functional device configuration region as an example, the quantity of wirings in corresponding first non-display region on the left side and the upper side in the functional device configuration region may be relatively small. Therefore, the present disclosure provides an embodiment that as shown in FIG. 8, for example, a part of the second sub-second-wiring 322 may be wired through the left side of the first non-display region 12, which may avoid space expansion of the first non-display region 12, avoid the influence of the space squeeze on remaining components in the region, and ensure the usage yield of entire display panel 100.

Referring to FIG. 8, optionally, the first non-display region 12 may include the first sub-non-display-region 121 and the second sub-non-display-region 122; and along the second direction, the first sub-non-display-region 121 may be on the side of the second sub-non-display-region 122 away from the second sub-second-region A22.

The quantity of the second sub-second-wirings 322 in the first sub-non-display-region 121 is K1, and the quantity of the second sub-second-wirings 322 in the second sub-non-display-region 122 is K2, where K1<K2.

For example, the functional device configuration region 10 provided by the present disclosure may be used for disposing cameras, photosensitive devices and the like. Therefore, a part of the functional device configuration region 10 may transmit light, and some component configuration regions to assist the use of related devices may be also included in the functional device configuration region 10. For example, the functional device configuration region 10 may be divided into the light-transmitting region 11 and the first non-display region 12; and the first non-display region 12 may be optionally configured to surround the light-transmitting region 11.

The present disclosure provides an optional embodiment that the first non-display region 12 may include the first sub-non-display-region 121 and the second sub-non-display-region 122 on two sides of the light-transmitting region 11 along the second direction, where the first sub-non-display-region 121 may be on the side of the second sub-non-display-region 122 away from the center point of the display panel 100. Taking current mainstream display panel including the functional device configuration region as an example, the quantity of wirings in corresponding first non-display region on the left side and the upper side in the functional device configuration region may be relatively small. Therefore, the present disclosure provides an embodiment that the quantity of wirings disposed in the first non-display region 12 on the left may be less than the quantity of wirings disposed in the first non-display region 12 on the right. When being applied to the present disclosure, at least a part of the second sub-second-wiring 322 may be configured in the first non-display region 12; and when the second sub-second-wirings 322 are on the side of the light-transmitting region 11 adjacent to the first sub-second-wiring 321, the quantity of the second sub-second-wirings 322 in the first sub-non-display-region 121 may be configured to be less than the quantity of the second sub-second-wirings 322 in the second sub-non-display-region 122.

Through above-mentioned configuration, a part of the second sub-second-wirings 322 may be wired through the left and right sides of the first non-display region 12, which may avoid space expansion of the first non-display region 12, avoid the influence of the space squeeze on remaining components in the region, and ensure the usage yield of entire display panel 100.

Figure 9:
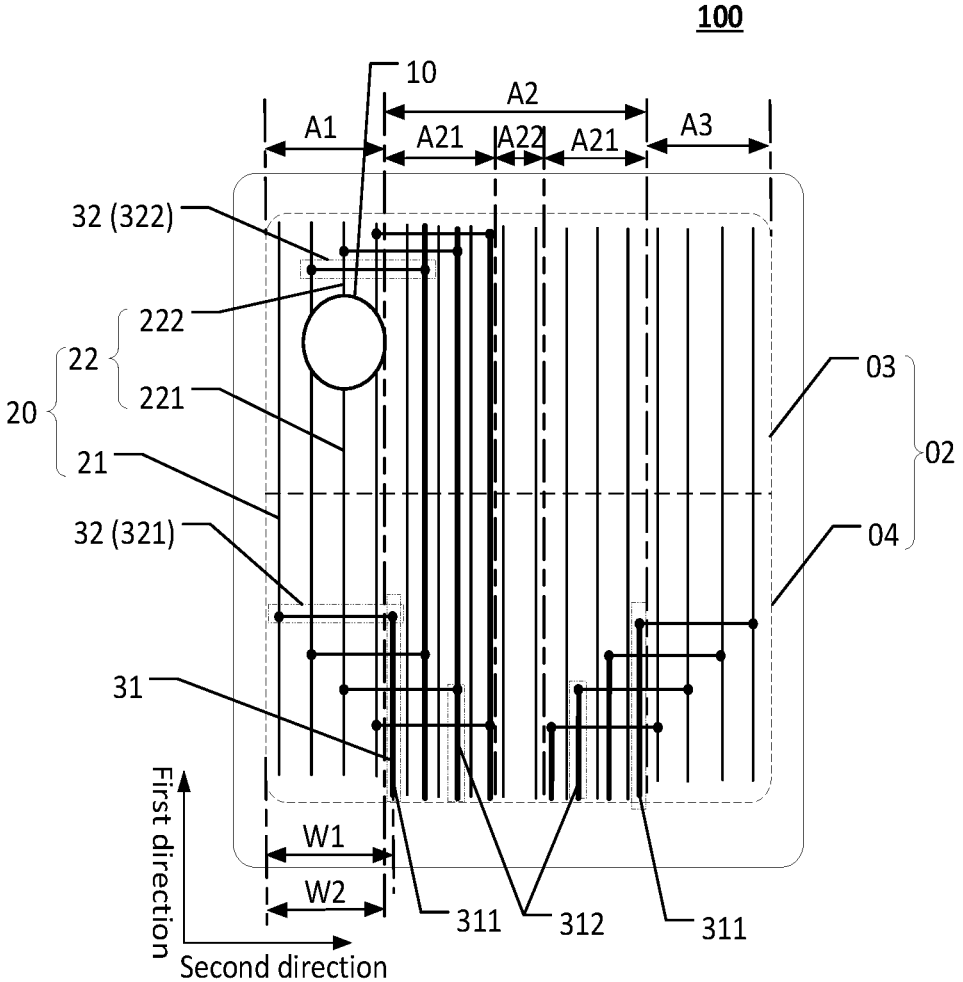
FIG. 9 illustrates another schematic of a display panel according to various embodiments of the present disclosure.

FIG. 9 illustrates another schematic of a display panel according to various embodiments of the present disclosure. Referring to FIGS. 2 and 9, optionally, along the second direction, the first-wirings 31 in the first sub-second-region A21 may include the first sub-first-wiring 311 and the second sub-first-wiring 312; the first sub-first-wiring 311 may be on the side of the second sub-first-wiring 312 away from the second sub-second-region A22; and the length of the first sub-first-wiring 311 along the first direction is L1, and the length of the second sub-first-wiring 312 along the first direction is L2, where L1<L2, or L1>L2.

For example, along the second direction, the first-wirings 31 in the first sub-second-region A21 may include the first sub-first-wiring 311 and the second sub-first-wiring 312, where the first sub-first-wiring 311 may be on the side of the second sub-second-region A22 away from the center of the display region 02 from the second sub-first-wiring 312. The present disclosure provides at least two optional configuration manners. For the first configuration manner, as shown in FIG. 2, along the first direction, the length of the first sub-first-wiring 311 may be less than the length of the second sub-first-wiring 312. For the second configuration manner, as shown in FIG. 9, along the first direction, the length of the first sub-first-wiring 311 may be greater than the length of the second sub-first-wiring 312.

In other words, along the direction from the first region A1 to the second sub-second-region A22, and/or along the direction from the third region A3 to the second sub-second-region A22, the length of the first-wirings 31 along the first direction may be increased (as shown in FIG. 2) or may be decreased (as shown in FIG. 9). By configuring adjacently arranged first-wirings 31 to have different lengths, the case that the second-wirings 32 electrically connected to the first-wirings 31 on a same layer may be avoided, and mutual interference in the process of electrical signal transmission may be avoided, thereby being beneficial for ensuring the stability and yield of the picture display of the display panel 100.

Figure 10:
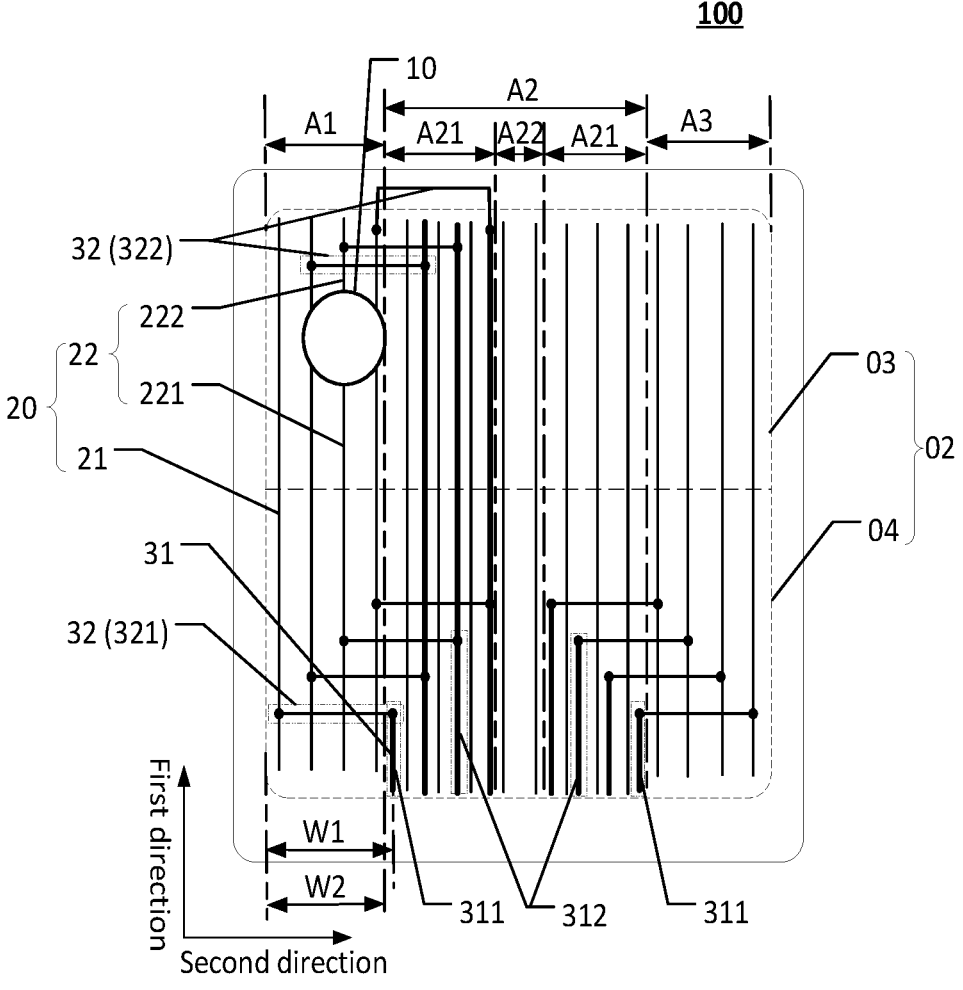
FIG. 10 illustrates another schematic of a display panel according to various embodiments of the present disclosure.

FIG. 10 illustrates another schematic of a display panel according to various embodiments of the present disclosure. Referring to FIG. 10, optionally, the display panel 100 may include the non-display region 01, and the non-display region 01 may at least partially surround the display region 02; and the second sub-second-wiring 322 may be in the non-display region 01.

For example, the present disclosure also provides an optional configuration manner that along the first direction, taking the non-display region 01 adjacent to the components that output electrical signals to the data lines 20 as an example, the second-wiring 32 on the side of the light-transmitting region 11 of the functional device configuration region 10 adjacent to the non-display region 01 may be the first sub-second-wiring 321, and the second-wiring 32 on the side of the light-transmitting region 11 of the functional device configuration region 10 away from the non-display region 01 may be the second sub-second-wiring 322.

The non-display region 01 of the display panel 100 may be configured around the display region 02. At this point, at least one second sub-second-wiring 322 may be optionally disposed in the non-display region 01 on the side of the functional device configuration region 10 away from the non-display region 01 where the components are located; or in the case that the space of the non-display region 01 is sufficient, all second sub-second-wirings 322 may also be selected to be disposed in the non-display region 01 on the side of the functional device configuration region 10 away from the non-display region 01 where the components are located. Such configuration may reduce the occupation of the region of the display region 02 by added second sub-second-wirings 322, avoid the interference of additional wirings on other wirings in the display panel 100, and may be beneficial for ensuring the stability and yield of the display panel 100.

Figure 11:
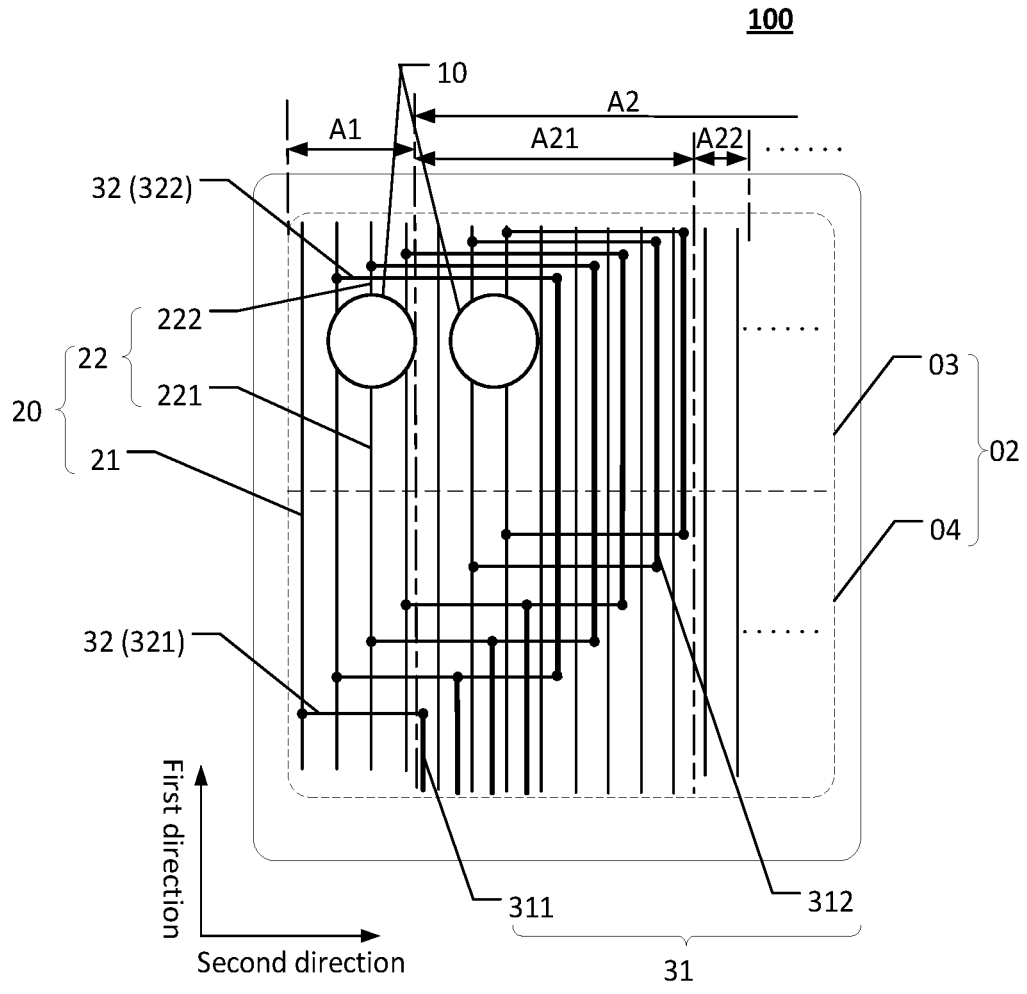
FIG. 11 illustrates another schematic of a display panel according to various embodiments of the present disclosure.

FIG. 11 illustrates another schematic of a display panel according to various embodiments of the present disclosure. Referring to FIG. 11, optionally, the display panel 100 may include at least two functional device configuration regions 10.

The first-wirings 31 may include the first sub-first-wiring 311 and second sub-first-wiring 312.

The display panel may include at least one second data line 22. The first sub-data-line 221 included in the second data line 22 may be electrically connected to the first sub-first-wiring 311 through the first sub-second-wiring 321. The second sub-data-line 222 included in the second data line 22 may be electrically connected to the first sub-first-wiring 311 through the second sub-second-wiring 322, the second sub-first-wiring 312, and the first sub-second-wiring 321. The first sub-first-wiring 311 may be on the side of the second sub-first-wiring 312 adjacent to the functional device configuration region 10.

For example, each display panel 100 may not only include only one functional device configuration region 10 but may also optionally configure the display panel 100 to include two or more functional device configuration regions 10. Herein, the present disclosure provides an optional embodiment that as shown in FIG. 11, the display panel 100 may include two functional device configuration regions 10. At this point, the first-wirings 31 extending along the first direction may include the first sub-first-wiring 311 and the second sub-first-wiring 312; and the second sub-first-wiring 312 may not be overlapped with the extension direction of the first sub-first-wiring 311. At this point, at least one second data line 22 may be included; the first sub-data-line 221 included in the first sub-data-line 221 may be electrically connected to the first sub-first-wiring 311 after passing the first sub-second-wiring 321; and the second sub-data-lines 222 included in the second data line 22 may be electrically connected to above-mentioned first sub-first-wiring 311 through the second sub-second-wiring 322, the second sub-first-wiring 312, and above-mentioned first sub-second-wiring 321. That is, in the process of receiving the electrical signals, at least one of the first sub-data-lines 221 and the second sub-data-lines 222 included in the second data line 22 may both need to pass a same first sub-first-wiring 311 and a same first sub-second-wiring 321.

In addition, if there is a functional device configuration region 10 arranged relatively adjacent to the central region of the display panel 100, at this point, the data line 20 passing the functional device configuration region 10 may be configured to be directly electrically connected to the components that output corresponding electrical signals in the non-display region 01, and the electrical connection of the data line 20 disconnected in the functional device configuration region 10 may be realized through the first connection line 41 and the second connection line 42. Therefore, the electrical connection of the data lines 20 disposed on two sides of the functional device configuration region 10 along the first direction may be realized, and normal transmission of corresponding electrical signals may be realized.

Referring to FIG. 11, optionally, on the basis that above-mentioned display panel 100 includes two functional device configuration regions 10, the present disclosure further provides an optional embodiment that the display region 02 may include the first display region 03 and the second display region 04 which are arranged along the first direction; the first display region 03 may include the functional device configuration region 10; and in the first display region 03, the quantity of the data lines 20 passing the functional device configuration region 10 is D5, the quantity of the second sub-first-wirings 312 is D6, and D5:D6=1.

For example, in the display panel 100 provided with two functional device configuration regions 10 of the present disclosure, the quantity of data lines 20 passing the functional device configuration region 10 may be configured to be equal to the quantity of the second sub-first-wirings 312 in the first display region 03 where the functional device configuration regions 10 are located. That is, the configuration of the second sub-first-wiring 312 may be to provide electrical signals to the second sub-data-line 222 through the functional device configuration region 10. Therefore, as long as the quantity of data lines 20 passing the functional device configuration region 10 is equal to the quantity of the second sub-first-wirings 312, normal transmission of electrical signals of each data line 20 in the first display region 03 of the display panel 100 may be satisfied, which may be avoid adding excessive wirings in the display region 02 and further avoid the interference of the additional wirings on other wirings, thereby being beneficial for ensuring the stability and yield of the picture display of the display panel 100.

Referring to FIG. 11, optionally, the first-wiring 31 and the data line 20 may be fabricated in a same layer using a same process; and the second-wiring 32 and the data line 20 may be fabricated in different layers.

For example, in an optional embodiment provided in the present disclosure, since both the first-wirings 31 and the data lines 20 extend along the first direction, in order to avoid the functional device configuration region 10 and avoid the influence of electrical signals generated by being electrically connected to other data lines 20, the first-wirings 31 may not occupy the region in the display region 02 where the data lines 20 are originally arranged. For example, the first-wiring 31 may be arranged between two adjacent data lines 20. As disclosed above, optionally, the first-wirings 31 and the data lines 20 may be configured to be fabricated in a same layer using a same process, which may avoid the influence of additional first-wirings 31 on increasing process of the display panel 100 and also avoid fabrication cost increase of the display panel 100. In addition, since the second-wiring 32 extends along the second direction, the extension direction of the second-wiring 32 may intersect the extension direction of the data line 20. In order to avoid the contact between the second-wiring 32 and the data wire 20 and avoid the influence of the second-wiring 32 on the electrical signal of the data wire 20, the second-wiring 32 and the data wire 20 may be fabricated in different layers. That is, an insulating layer may be included between the metal layer of the second-wiring 32 and the metal layer of the data line 20 for insulation, which may ensure the stability of the electrical signals received by each signal in the display panel 100 and improve the display effect of the display panel 100.

It should be noted that the present disclosure may not limit that the first-wiring 31 must be fabricated in a same layer as the data line 20. If the quantity of film layers and the space are allowed, the first-wiring 31, the second-wiring 32, and the data line 20 may also be disposed in different layers. In addition, the present disclosure may not limit that all data lines 20 must be in a same metal layer. Similarly, the first-wirings 31 included in the display panel 100 may also be distributed in different metal layers, and the second-wirings 32 included in the display panel 100 may also be distributed in different metal layers. That is, the film layers corresponding to various types of wirings in the display panel 100 may be configured, and the user may make corresponding adjustments according to actual products, which may not be limited in the present disclosure.

Figure 12:
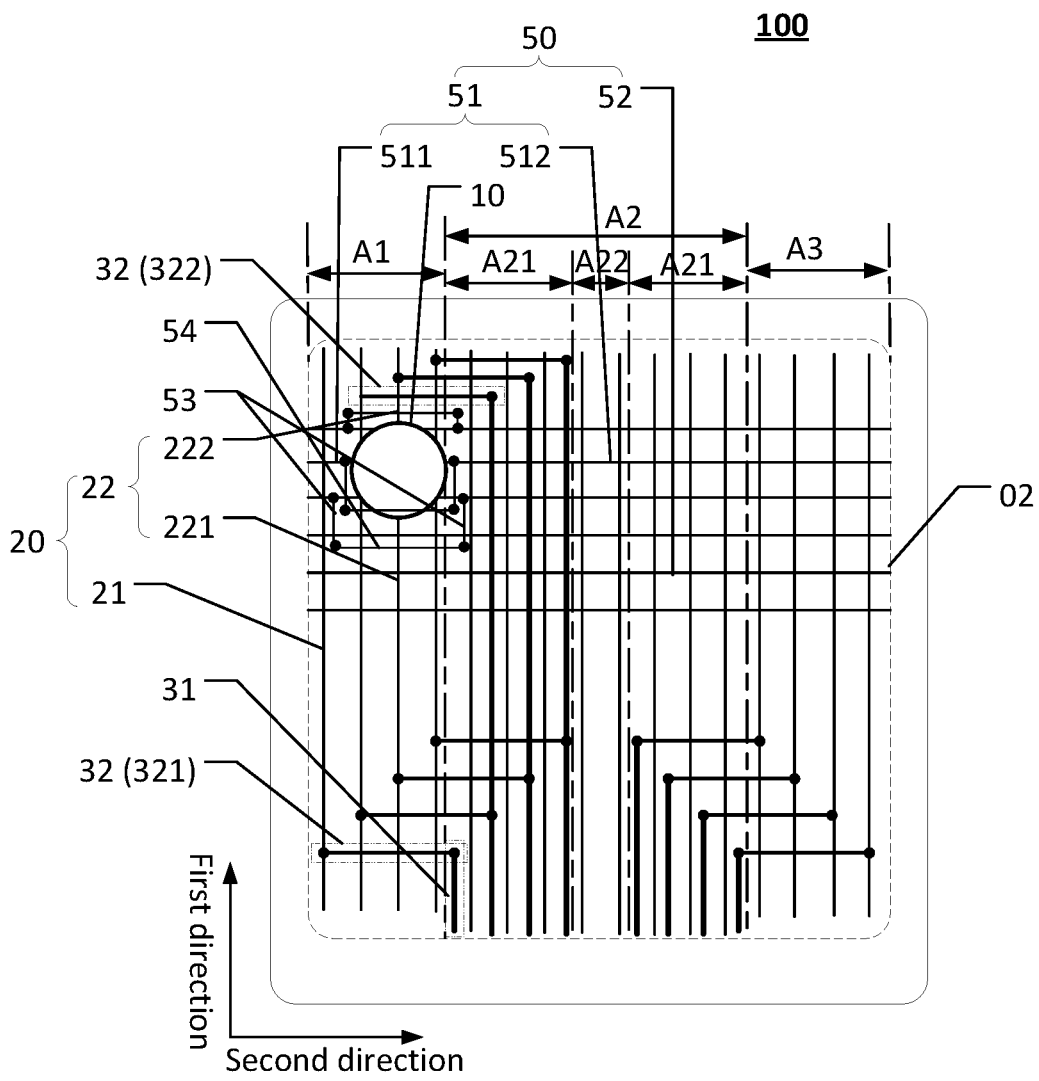
FIG. 12 illustrates another schematic of a display panel according to various embodiments of the present disclosure.

FIG. 12 illustrates another schematic of a display panel according to various embodiments of the present disclosure. Referring to FIG. 12, optionally, the display panel may include a plurality of scan lines 50 which is arranged along the first direction and extends along the second direction. The scan lines 50 may include the first scan line 51; each first scan line 51 may include the first sub-first-scan-line 511 and the second sub-first-scan-line 512; the first sub-first-scan-line 511 and the second sub-first-scan-line 512 may be respectively disposed on two sides of the functional device configuration region 10.

The first sub-first-scan-line 511 and the second sub-first-scan-line 512 may be electrically connected through the third connection line 53 and the fourth connection line 54. The third connection line 53 may extend along the first direction, and the fourth connection line 54 may extend along the second direction.

For example, the display panel 100 may further include scan lines 50; and the extension direction of the scan lines 50 may intersect the extension direction of the data lines 20. The present disclosure provides an optional embodiment that the scan lines 50 in the display panel 100 may include the first scan line 51 that needs to pass the functional device configuration region 10 and the second scan line 52 that does not pass the functional device configuration region 10. Therefore, the first scan line 51 may be a two-segment structure in the functional device configuration region 10. For example, the first scan line 51 may include the first sub-first-scan-line 511 and the second sub-first-scan-line 512 respectively disposed on two sides of the functional device configuration region 10. In order to realize that the first scan line 51 can receive same electrical signals, a set of wiring structures may be optionally added, which may include two third connection lines 53 extending along the first direction, and one fourth connection line 54 extending along the second direction. For example, one end of the third connection line 53 may be electrically connected to the first end of the fourth connection line 54, and another end of the third connection line 53 may be electrically connected to the first sub-first-scan-line 511; and one end of another third connection line 53 may be electrically connected to the second end of the fourth connection line 54, and another end of another third connection line 53 may be electrically connected to the second sub-first-scan-line 512.

Through above-mentioned configuration manner, additional third connection lines 53 and fourth connection line 54 may be used to connect two segments of the first scan line 51 on two sides of the functional device configuration region 10, which may be beneficial for ensuring the transmission of electrical signals of the scan lines 50 in the display panel 100 and also ensuring normal display effect of the display panel 100.

Referring to FIG. 12, optionally, the third connection wire 53 and the first-wiring 31 may be fabricated in a same layer using a same material, and the fourth connection wire 54 and the second-wiring 32 may be fabricated in a same layer using a same material.

For example, in an optional embodiment provided in the present disclosure, since the first-wiring 31 and the third connection line 53 both extend along the first direction, the first-wiring 31 and the third connection line 53 may be optionally selected to be fabricated in a same layer using a same material, which may avoid the fabrication process increase of the display panel 100 due to additional third connection line 53 on the basis of the first-wiring 31 and also avoid the fabrication cost increase of the display panel 100. In addition, since both the second-wiring 32 and the fourth connection wire 54 extend along the second direction, the second-wiring 32 and the fourth connection wire 54 may be optionally selected to be fabricated in a same layer using a same material, which may avoid the fabrication process increase of the display panel 100 due to additional fourth connection line 54 on the basis of the second-wiring 32 and also avoid the fabrication cost increase of the display panel 100. It should be noted that the stability of the electrical signals received by each signal in the display panel 100 may also be ensured through above-mentioned wiring manners, and the display effect of the display panel 100 may be improved.

It should also be noted that the present disclosure may not limit that the first-wiring 31 must be fabricated in a same layer as the third connection line 53, and the fourth connection line 54 must be fabricated in a same layer as the second-wiring 32. If the quantity of film layers and the space are allowed, the first-wiring 31, the second-wiring 32, the third connection line 53, and the fourth connection line 54 may also be disposed in different layers. In addition, the present disclosure may not limit that all of the first-wirings 31, the second-wirings 32, the third connection wires 53 and the fourth connection wires 54 must be in a same metal layer. That is, various types of wirings included in the display panel 100 can also be distributed in different metal layers. That is, the film layers corresponding to various types of wirings in the display panel 100 may be configured, and the user may make corresponding adjustments according to actual products, which may not be limited in the present disclosure.

Figure 13:
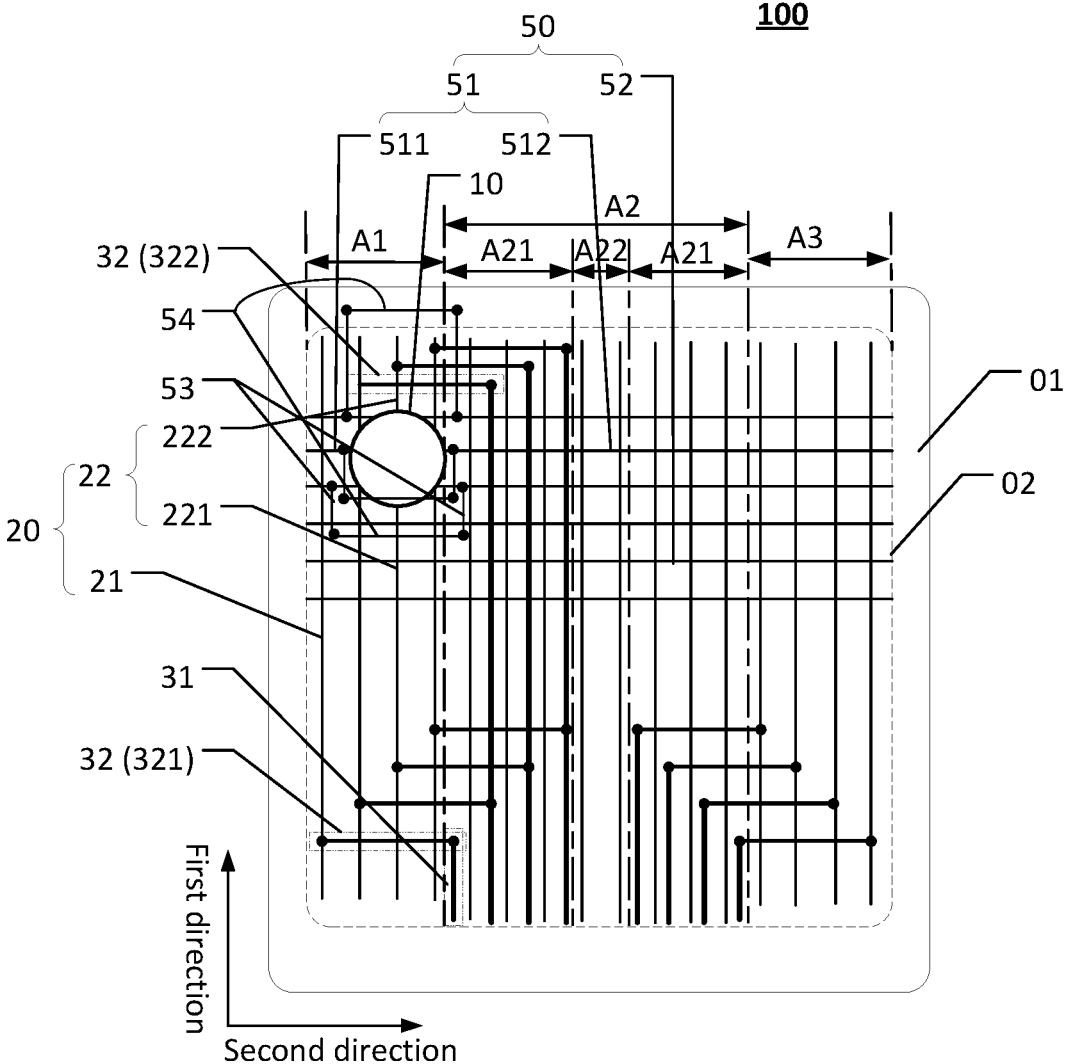
FIG. 13 illustrates another schematic of a display panel according to various embodiments of the present disclosure.

FIG. 13 illustrates another schematic of a display panel according to various embodiments of the present disclosure. Referring to FIGS. 12 and 13, optionally, the display panel 100 may include the non-display region 01; the non-display region 01 may at least partially surround the display region 02; and at least one fourth connection line 54 may be in the non-display region 01.

For example, when the first scan lines 51 separated by the functional device configuration region 10 needs to be electrically connected through the third connection lines 53 and the fourth connection lines 54, as shown in FIG. 13, at least one fourth connection line 54 disposed in the display panel 100 may be selected to be configured in the non-display region 01 surrounding the display region 02, or in the case that the non-display region 01 has enough space, all of the fourth connection lines 54 in the non-display region 01 may be configured in the non-display region 01. Such configuration may reduce the occupation of the region of the display region 02 by additional fourth connection lines 54 and avoid the interference of additional wirings on other wirings in the display panel 100, which may be beneficial for ensuring the stability and yield of the picture display of the display panel 100.

Figure 14:
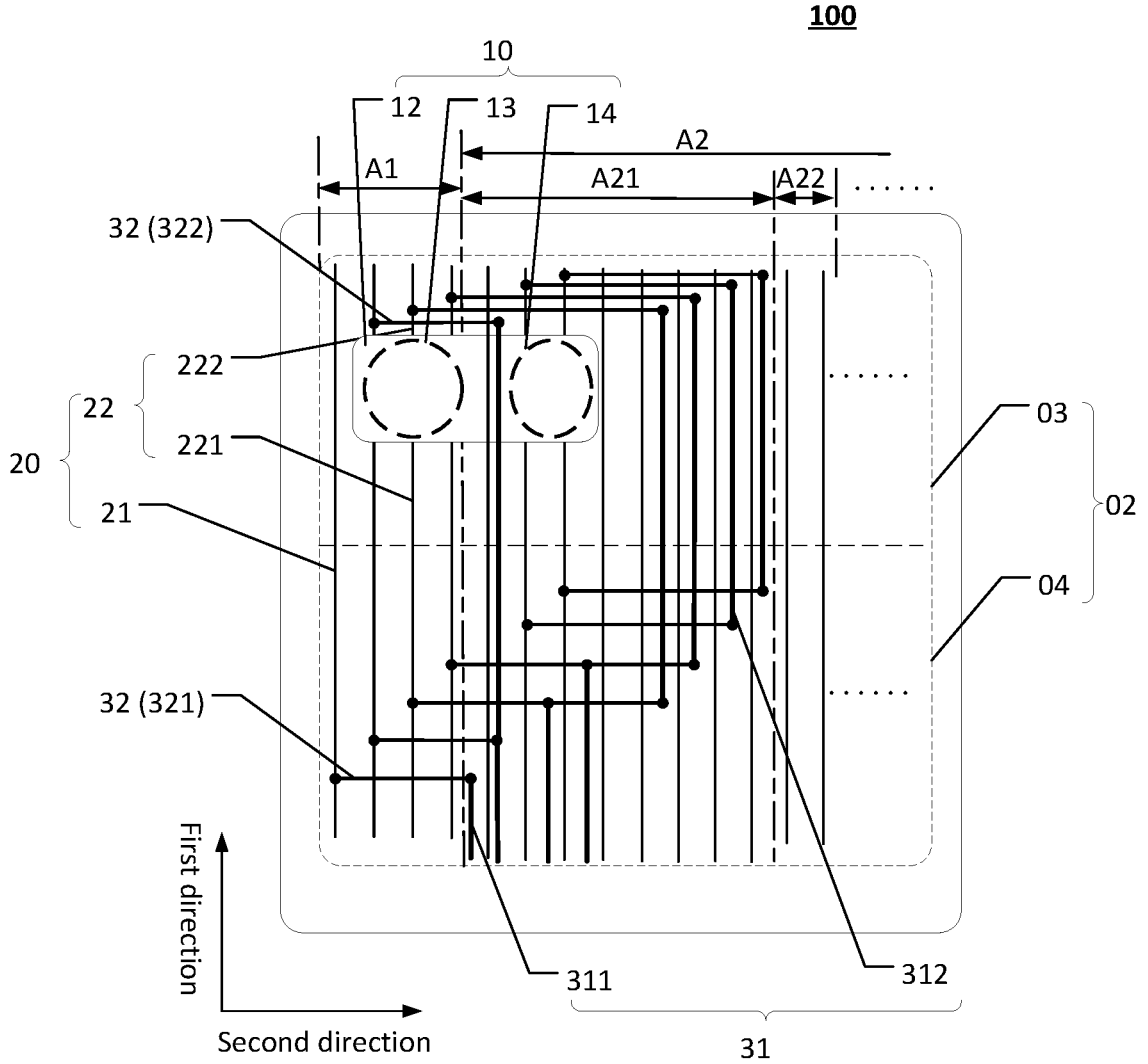
FIG. 14 illustrates another schematic of a display panel according to various embodiments of the present disclosure.

FIG. 14 illustrates another schematic of a display panel according to various embodiments of the present disclosure. Referring to FIG. 14, optionally, the functional device configuration region 10 may include the first component configuration region 13, the second component configuration region 14 and the first non-display region 12; the first non-display region 12 may surround the first component configuration region 13 and the second component configuration region 14; the orthographic projection of the first component configuration region 13 on the plane where the display panel 100 is located may not be overlapped with the orthographic projection of the second component configuration region 14 on the plane where the display panel 100 is located; and at least one first-wiring 31 may be between the first element configuration region 13 and the second element configuration region 14.

For example, the present disclosure also provides a functional device configuration region 10 configured along a racetrack-like shape. For example, the functional device configuration region 10 may include the first component configuration region 13, the second component configuration region 14 and the first non-display region 12. The first non-display region 12 may surround both the first component configuration region 13 and the second component configuration region 14. That is, the display region 02 may not be included between the first component configuration region 13 and the second component configuration region 14. At this point, at least one first-wiring 31 may be optionally configured to be wired through the first non-display region 12 between the first component configuration region 13 and the second component configuration region 14.

In such way, a part of the non-display region 01 of the functional device configuration region 10 may be reused for configuring the first-wiring 31, which may reduce the occupation of the region of the display region 02 by the configuration of the first-wiring 31, prevent the first-wiring 31 from interfering other wirings in the display panel 100 and may be beneficial for ensuring the stability and yield of the picture display of the display panel 100.

Figure 15:
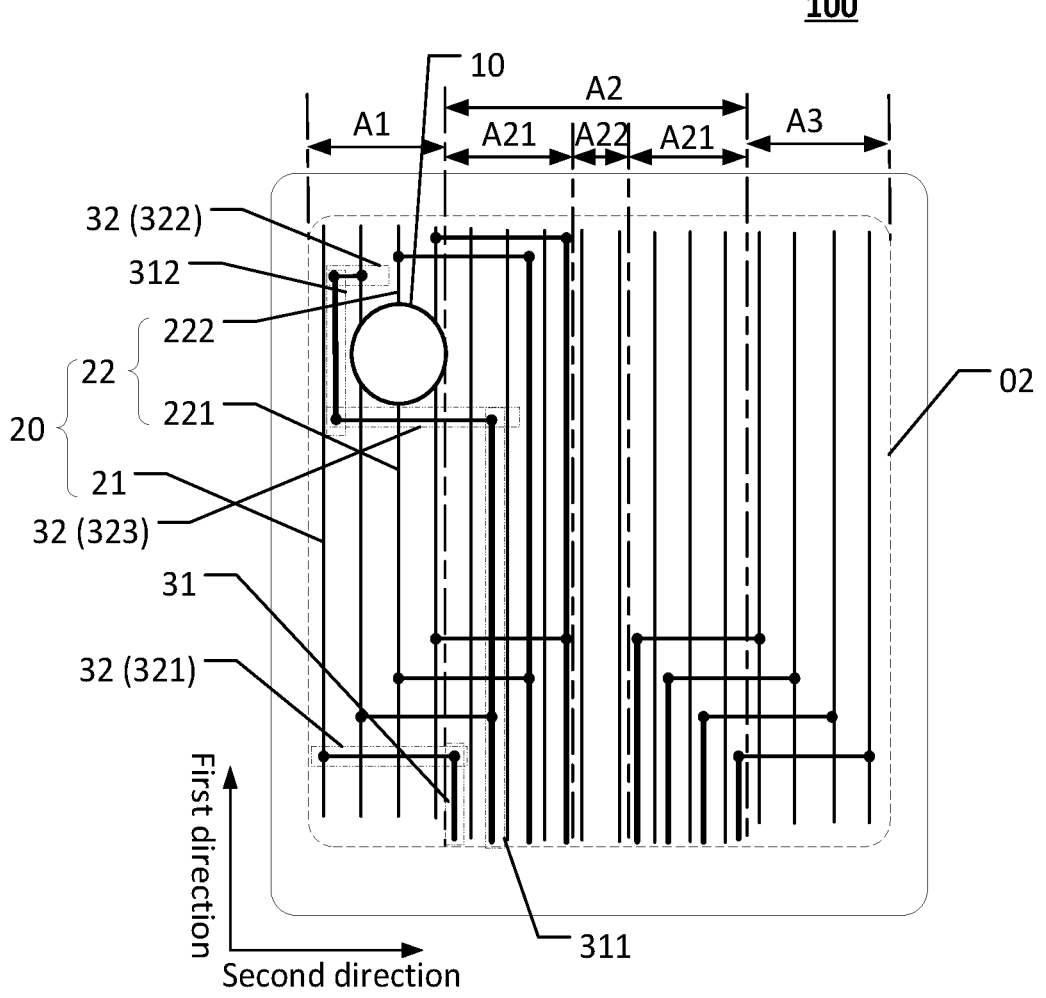
FIG. 15 illustrates another schematic of a display panel according to various embodiments of the present disclosure.

FIG. 15 illustrates another schematic of a display panel according to various embodiments of the present disclosure. Referring to FIG. 15, optionally, the first-wirings 31 may include the first sub-first-wiring 311 and the second sub-first-wiring 312; the first sub-first-wiring 311 may be on the side of the functional device configuration region 10 adjacent to the second sub-second-region A22; and the second sub-first-wiring 312 may be on the side of the functional device configuration region 10 away from the second sub-second-region A22.

The second-wirings 32 may further include the third sub-second-wiring 323. One end of the first sub-second-wiring 321 may be electrically connected to the first sub-data-line 221, and another end of the first sub-second-wiring 321 may be electrically connected to the first sub-first-wiring 311. One end of the third sub-second-wiring 323 may be electrically connected to the first sub-first-wiring 311, and another end of the third sub-second-wiring 323 may be electrically connected to the second sub-first-wiring 312. One end of the second sub-second-wiring 322 may be electrically connected to the second sub-data-line 222, and another end of the second sub-second-wiring 322 may be electrically connected to the second sub-first-wiring 312.

For example, the present disclosure also provides an optional configuration manner that the first-wiring 31 used to be electrically connected to the first sub-data-line 221 and the second sub-data-line 222 in the second data line 22 may have two segments which may include, for example, the first sub-first-wiring 311 and the second sub-first-wiring 312. At this point, along the second direction, the first sub-first-wiring 311 and the second sub-first-wiring 312 may be disposed in regions on two sides of the functional device configuration region 10, respectively; and the second sub-first-wiring 312 and the region in the extension direction of the second sub-first-wiring 312 may not be overlapped with the first sub-first-wiring 311 and the region in the extension direction of the first sub-first-wiring 311. Furthermore, the second-wiring 32 may be configured to include three sub-wirings, for example, the first sub-second-wiring 321, the second sub-second-wiring 322 and the third sub-third-wiring. It configures that one end of the first sub-second-wiring 321 may be electrically connected to the first sub-data-line 221, and another end of the first sub-second-wiring 321 may be electrically connected to the first sub-first-wiring 311; one end of the third sub-second-wiring 323 may be electrically connected to the first sub-first-wiring 311, and another end of the third sub-second-wiring 323 may be electrically connected to the second sub-first-wiring 312; and one end of the second sub-second-wiring 322 may be electrically connected to the second sub-data-line 222, and another end of the second sub-second-wiring 322 may be electrically connected to the second sub-first-wiring 312. Therefore, the transmission of the electrical signals to the second data line 22 may be realized through the first-wiring 31 and the second-wiring 32, which may ensure normal display effect of the display panel 100. In addition, for such configuration, all data lines 20 disposed on the edge of the display region 02 may be electrically connected to the components in the lower frame through the central region of the display region 02 by means of the first-wirings 31 and the second-wirings 32. Such configuration may reduce the wiring space that needs to be occupied when the data lines 20 are electrically connected to the components in the lower frame, for example, the wiring space of the R corner region corresponding to the lower frame of the display panel 100. Therefore, the wirings width required by the non-display region 01 in the lower frame may be reduced, which may achieve the effect of reducing the lower frame of the display panel 100 and increase the screen-to-body ratio of the display panel 100.

Referring to FIG. 15, optionally, the quantity of the first-wirings 31 on the side of the functional device configuration region 10 away from the second sub-second-region A22 is K3, and the quantity of the first-wirings 31 on the side of the functional device configuration region 10 adjacent to the second sub-second-region A22 is K4, where K3<K4.

For example, the present disclosure provides an optional configuration manner that along the second direction, the functional device configuration region 10 may be on the side of the center of the display panel 100 adjacent to the edge of the display region 02. As shown in FIG. 15, the function configuration region may be in the upper left region of the display panel 100. In order to enable more data lines 20 and first-wirings 31 to be electrically connected to the components in the lower frame at the central region of the display region 02, it configures that the quantity of the first-wirings 31 on the side of the device configuration region away from the second sub-second-region A22 may be less than the quantity of the first-wirings 31 on the side of the functional device configuration region 10 adjacent to the second sub-second-region A22. In such way, more wirings electrically connected to the components in the lower frame may aggregate toward the center of the display region 02. Such configuration may reduce the wiring space that needs to be occupied when the data lines 20 are electrically connected to the components in the lower frame, for example, the wiring space of the R corner region corresponding to the lower frame of the display panel 100. Therefore, the wirings width required by the non-display region 01 in the lower frame may be reduced, which may achieve the effect of reducing the lower frame of the display panel 100 and increase the screen-to-body ratio of the display panel 100.

Figure 16:
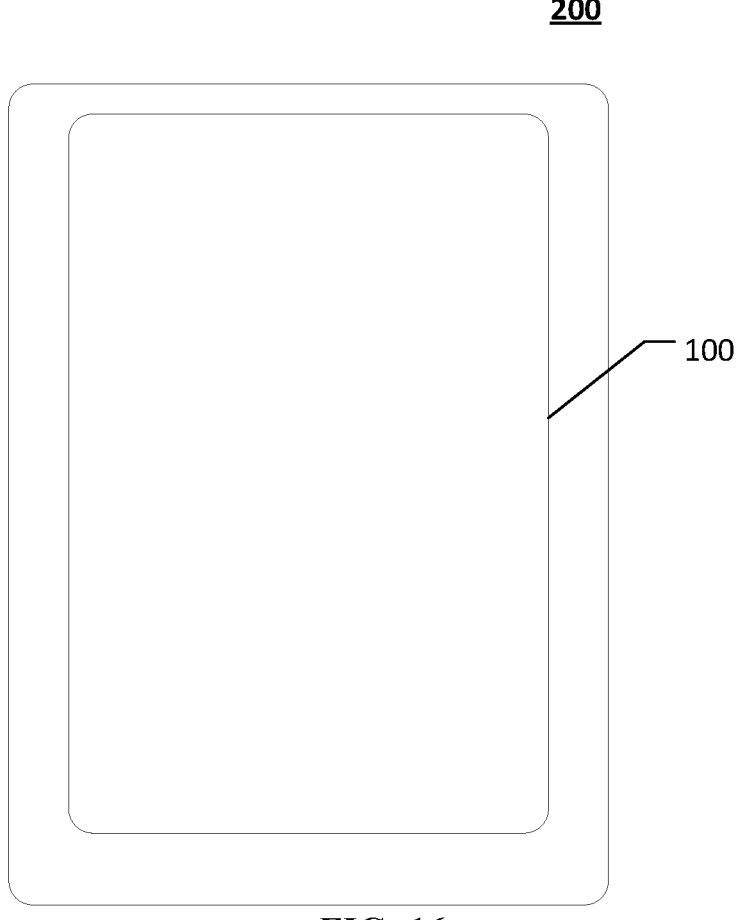
FIG. 16 illustrates a schematic of a display apparatus according to various embodiments of the present disclosure.

FIG. 16 illustrates a schematic of a display apparatus according to various embodiments of the present disclosure. Referring to FIGS. 1-16, based on the same inventive concept, the present disclosure further provides a display apparatus 200 including the display panel 100. The display panel 100 may be any display panel 100 provided in the present disclosure.

It should be noted that, embodiments of the display apparatus 200 provided by embodiments of the present disclosure may refer to embodiments of the display panel 100 described above, which may not be described in detail in the present disclosure. The display apparatus 200 provided in the present application may be any product or component with display function, such as a mobile phone, a tablet computer, a television, a monitor, a notebook computer, a navigator, and the like.

From above-mentioned embodiments, it may be seen that the display panel and the display apparatus provided by the present disclosure may achieve at least following beneficial effects.

The present disclosure provides the display panel and the display apparatus. Through the first-wirings and the second-wirings arranged in the central region of the display region along the extension direction perpendicular to the data lines, the transmission of the electrical signals of the data lines corresponding to the functional device configuration region disposed in the display region of the display panel and the electrical signals of the data lines on the side of the functional device configuration region away from the center of the display panel, which may avoid that the data lines corresponding to the functional device configuration region and the data lines on the side of the functional device configuration region away from the center of the display panel need to be wired in the R corner region when being electrically connected to the flexible circuit board. That is, in the present disclosure, by canceling the wiring connection of the data lines in the R corner, the objective of compressing the width of the lower frame may be achieved, and the screen-to-body ratio of the display apparatus may be increased.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A display panel, comprising:
a display region and at least one functional device configuration region, wherein the display region at least partially surrounds the at least one functional device configuration region;
a plurality of data lines which extends along a first direction and is arranged along a second direction, wherein the plurality of data lines includes a plurality of first data lines and a plurality of second data lines; a second data line of the plurality of second data lines includes a first sub-data-line and a second sub-data-line; and along the first direction, a first sub-data-line and a second sub-data-line in a same second data line are respectively arranged on two sides of the functional device configuration region; and a plurality of first-wirings extending along the first direction, and a plurality of second-wirings extending along the second direction, wherein:
one end of at least a part of the plurality of second-wirings is electrically connected to a first-wiring of the plurality of first-wirings, and another end of the at least the part of the plurality of second-wirings is electrically connected to a first data line of the plurality of first data lines;
the plurality of second-wirings include a plurality of first sub-second-wirings and a plurality of second sub-second-wirings; one end of at least a part of the plurality of first sub-second-wirings and one end of at least a part of the plurality of second sub-second-wirings are both electrically connected to a same first-wiring; another end of the at least the part of the plurality of first sub-second-wirings is electrically connected to the first sub-data-line; and another end of the at least the part of the plurality of second sub-second-wirings is electrically connected to the second sub-data-line in the same second data line corresponding to the first sub-data-line;
the display region includes a first region, a second region and a third region which are arranged in sequence along the second direction; and the second region is between the first region and the third region;
the second region includes a first sub-second-region and a second sub-second-region; and along the second direction, first sub-second-regions are symmetrically arranged on two sides of the second sub-second-region;
the display region includes a first display region and a second display region which are arranged along the first direction; and the first display region includes the functional device configuration region; and
in the first display region, a quantity of first-wirings in the first sub-second-region, which is between the second sub-second-region and the first region and adjacent to the first region, is D4; and in the second display region, a quantity of first-wirings in the first sub-second-region, which is between the second sub-second-region and the first region and adjacent to the first region, is D2, wherein D4<D2 in the first display region, a quantity of first-wirings in the first sub-second-region, which is between the second sub-second-region and the first region and adjacent to the first region, is D4; and in the second display region, a quantity of first-wirings in the first sub-second-region, which is between the second sub-second-region and the first region and adjacent to the first region, is D2, wherein D4<D2.

2. The display panel according to claim 1, wherein:
multiple data lines in the first region are electrically connected to multiple second-wirings;
the plurality of first-wirings is all in the first sub-second-regions, and the first sub-second-region further includes multiple data lines;
the second sub-second-region includes multiple data lines; and
multiple data lines included in the third region are electrically connected to multiple second-wirings.

3. The display panel according to claim 2, wherein:
the display region includes a first display region and a second display region which are arranged along the first direction; and the first display region includes the functional device configuration region; and in the second display region, a quantity of data lines in the first region is D1, wherein D1:D2=1.

4. The display panel according to claim 2, wherein:
the display region includes a first display region and a second display region which are arranged along the first direction; and the first display region includes the functional device configuration region; and
in the first display region, a quantity of data lines passing the functional device configuration region is D3, wherein D4:D3<1.

5. The display panel according to claim 2, wherein:
a width of the first region along the second direction is W1; W1 is a distance between an edge, on a side of the first region away from the second region, and a first-wiring, wherein the first-wiring has a largest distance from the second sub-second-region and is in the multiple first-wirings in the first sub-second-region which is between the second sub-second-region and the first region and adjacent to the first region; and a maximum distance between the edge on the side of the first region away from the second region and an edge on a side of the functional device configuration region adjacent to the second sub-second-region is W2; and
when W2<W1, a first sub-data-line and a second sub-data-line of each second data line are electrically connected to a same first-wiring.

6. The display panel according to claim 2, wherein:
a width of the first region along the second direction is W1; W1 is a distance between an edge, on a side of the first region away from the second region, and a first-wiring, wherein the first-wiring has a largest distance from the second sub-second-region and is in the multiple first-wirings in the first sub-second-region which is between the second sub-second-region and the first region and adjacent to the first region; and a maximum distance between the edge on the side of the first region away from the second region and an edge on a side of the functional device configuration region adjacent to the second sub-second-region is W2;
when W2>W1, a first sub-data-line and a second sub-data-line of at least one second data line in the first region are electrically connected to a same first-wiring; and a first sub-data-line and a second sub-data-line of at least one second data line are electrically connected through a first connection line and a second connection line; and
the first connection line extends along the first direction, and the second connection line extends along the second direction.

7. The display panel according to claim 6, wherein:
along the first direction, a first distance is between the first sub-data-line and the second sub-data-line which are electrically connected by the first connection line and the second connection line; and a second distance is between the first sub-second-wiring and the second sub-second-wiring which are electrically connected to a same first-wiring, wherein H2>H1.

8. The display panel according to claim 7, wherein:
the at least one second data line electrically connected through the first connection line and the second connection line is in the second region.

9. The display panel according to claim 7, wherein:
along the second direction, second data lines, which are electrically connected to first connection lines and second connection lines, are disposed on two sides of a second data line that is electrically connected to a same first-wiring.

10. The display panel according to claim 6, wherein:
the first connection line and a data line of the plurality of data lines are fabricated in a same layer using a same process; and the second connection line and the data line of the plurality of data lines are fabricated in different layers.

11. The display panel according to claim 6, further including:
a non-display region, wherein the non-display region at least partially surrounds the display region; and at least one first connection line is in the non-display region.

12. The display panel according to claim 2, wherein:
the functional device configuration region includes a light-transmitting region and a first non-display region surrounding the light-transmitting region; and
at least a part of the plurality of second sub-second-wirings is in the first non-display region, and the second sub-second-wiring is on a side of the light-transmitting region adjacent to the first sub-second-wiring.

13. The display panel according to claim 12, wherein:
the first non-display region includes a first sub-non-display-region and a second sub-non-display-region; and along the second direction, the first sub-non-display-region is on a side of the second sub-non-display-region away from the second sub-second-region; and
a quantity of second sub-second-wirings in the first sub-non-display-region is K1, and a quantity of second sub-second-wirings in the second sub-non-display-region is K2, wherein K1<K2.

14. The display panel according to claim 2, wherein:
along the second direction, the plurality of first-wirings in the first sub-second-region includes a first sub-first-wiring and a second sub-first-wiring; the first sub-first-wiring is on a side of the second sub-first-wiring away from the second sub-second-region; and a length of the first sub-first-wiring along the first direction is L1, and a length of the second sub-first-wiring along the first direction is L2, wherein L1<L2 or L1>L2.

15. The display panel according to claim 2, wherein:
the plurality of first-wirings includes a first sub-first-wiring and a second sub-first-wiring; the first sub-first-wiring is on a side of the functional device configuration region adjacent to the second sub-second-region; and the second sub-first-wiring is on a side of the functional device configuration region away from the second sub-second-region; and
the plurality of second-wirings further includes a third sub-second-wiring; one end of the first sub-second-wiring is electrically connected to the first sub-data-line, and another end of the first sub-second-wiring is electrically connected to the first sub-first-wiring; one end of the third sub-second-wiring is electrically connected to the first sub-first-wiring, and another end of the third sub-second-wiring is electrically connected to the second sub-first-wiring; and one end of the second sub-second-wiring is electrically connected to the second sub-data-line, and another end of the second sub-second-wiring is electrically connected to the second sub-first-wiring.

16. The display panel according to claim 15, wherein:
a quantity of first-wirings on the side of the functional device configuration region away from the second sub-second-region is K3, and a quantity of first-wirings on the side of the functional device configuration region adjacent to the second sub-second-region is K4, wherein K3<K4.

17. The display panel according to claim 1, wherein:

the functional device configuration region includes a light-transmitting region and a first non-display region surrounding the light-transmitting region; and at least a part of the plurality of second sub-second-wirings is in the first non-display region, and the second sub-second-wiring is on a side of the light-transmitting region away from the first sub-second-wiring.

18. The display panel according to claim 1, further including:

a non-display region, wherein the non-display region at least partially surrounds the display region; and the plurality of second sub-second-wirings is in the non-display region.

19. The display panel according to claim 1, wherein:

the display panel includes at least two functional device configuration regions;

the plurality of first-wirings includes a plurality of first sub-first-wirings and a plurality of second sub-first-wirings;

the display panel includes at least one second data line, wherein a first sub-data-line of the at least one second data line is electrically connected to a first sub-first-wiring through a first sub-second-wiring; a second sub-data-line of the at least one second data line is electrically connected to the first sub-first-wiring through a second sub-second-wiring, a second sub-first-wiring, and a first sub-second-wiring; and the first sub-first-wiring is on a side of the second sub-first-wiring adjacent to the functional device configuration region.

20. The display panel according to claim 19, wherein:

the display region includes a first display region and a second display region which are arranged along the first direction; and the first display region includes the functional device configuration region; and in the first display region, a quantity of data lines passing the functional device configuration region is D5, and a quantity of second sub-first-wirings is D6, wherein D5:D6=1.

21. The display panel according to claim 1, wherein:

the plurality of first-wirings and the plurality of data lines are fabricated in a same layer using a same process; and the plurality of second-wirings and the plurality of data lines are fabricated in different layers.

22. The display panel according to claim 1, further including:

a plurality of scan lines which is arranged along the first direction and extends along the second direction, wherein the plurality of scan lines includes a plurality of first scan lines; each first scan line includes a first sub-first-scan-line and a second sub-first-scan-line; and the first sub-first-scan-line and the second sub-first-scan-line are respectively disposed on two sides of the functional device configuration region;

the first sub-first-scan-line and the second sub-first-scan-line are electrically connected with each other through a third connection line and a fourth connection line; and the third connection line extends along the first direction, and the fourth connection line extends along the second direction.

23. The display panel according to claim 22, further including:

a non-display region, wherein the non-display region at least partially surrounds the display region; and at least one fourth connection line is in the non-display region.

24. The display panel according to claim 1, wherein:

the functional device configuration region includes a first component configuration region, a second component configuration region and a first non-display region; the first non-display region surrounds the first component configuration region and the second component configuration region; an orthographic projection of the first component configuration region on a plane of the display panel is not overlapped with an orthographic projection of the second component configuration region on the plane of the display panel; and at least one first-wiring is between the first component configuration region and the second component configuration region.

25. A display apparatus, comprising:

a display panel, comprising:

a display region and at least one functional device configuration region, wherein the display region at least partially surrounds the at least one functional device configuration region;

a plurality of data lines which extends along a first direction and is arranged along a second direction, wherein the plurality of data lines includes a plurality of first data lines and a plurality of second data lines; a second data line of the plurality of second data lines includes a first sub-data-line and a second sub-data-line; and along the first direction, a first sub-data-line and a second sub-data-line in a same second data line are respectively arranged on two sides of the functional device configuration region; and a plurality of first-wirings extending along the first direction, and a plurality of second-wirings extending along the second direction, wherein:

one end of at least a part of the plurality of second-wirings is electrically connected to a first-wiring of the plurality of first-wirings, and another end of the at least the part of the plurality of second-wirings is electrically connected to a first data line of the plurality of first data lines;

the plurality of second-wirings include a plurality of first sub-second-wirings and a plurality of second sub-second-wirings; one end of at least a part of the plurality of first sub-second-wirings and one end of at least a part of the plurality of second sub-second-wirings are both electrically connected to a same first-wiring; another end of the at least the part of the plurality of first sub-second-wirings is electrically connected to the first sub-data-line; and another end of the at least the part of the plurality of second sub-second-wirings is electrically connected to the second sub-data-line in the same second data line corresponding to the first sub-data-line;

the display region includes a first region, a second region and a third region which are arranged in sequence along the second direction; and the second region is between the first region and the third region;

the second region includes a first sub-second-region and a second sub-second-region; and along the second direction, first sub-second-regions are symmetrically arranged on two sides of the second sub-second-region;

the display region includes a first display region and a second display region which are arranged along the first direction; and the first display region includes the functional device configuration region; and in the first display region, a quantity of first-wirings in the first sub-second-region, which is between the second sub-second-region and the first region and adjacent to the first region, is D4; and in the second display region, a quantity of first-wirings in the first sub-second-region, which is between the second sub-second-region and the first region and adjacent to the first region, is D2, wherein D4<D2 in the first display region, a quantity of first-wirings in the first sub-second-region, which is between the second sub-second-region and the first region and adjacent to the first region, is D4; and in the second display region, a quantity of first-wirings in the first sub-second-region, which is between the second sub-second-region and the first region and adjacent to the first region, is D2, wherein D4<D2.

26. A display panel, comprising:

a display region and at least one functional device configuration region, wherein the display region at least partially surrounds the at least one functional device configuration region;

a plurality of data lines which extends along a first direction and is arranged along a second direction, wherein the plurality of data lines includes a plurality of first data lines and a plurality of second data lines; a second data line of the plurality of second data lines includes a first sub-data-line and a second sub-data-line; and along the first direction, a first sub-data-line and a second sub-data-line in a same second data line are respectively arranged on two sides of the functional device configuration region; and a plurality of first-wirings extending along the first direction, and a plurality of second-wirings extending along the second direction, wherein:

one end of at least a part of the plurality of second-wirings is electrically connected to a first-wiring of the plurality of first-wirings, and another end of the at least the part of the plurality of second-wirings is electrically connected to a first data line of the plurality of first data lines;

the plurality of second-wirings include a plurality of first sub-second-wirings and a plurality of second sub-second-wirings; one end of at least a part of the plurality of first sub-second-wirings and one end of at least a part of the plurality of second sub-second-wirings are both electrically connected to a same first-wiring; another end of the at least the part of the plurality of first sub-second-wirings is electrically connected to the first sub-data-line; and another end of the at least the part of the plurality of second sub-second-wirings is electrically connected to the second sub-data-line in the same second data line corresponding to the first sub-data-line;

the display panel further includes a plurality of scan lines which is arranged along the first direction and extends along the second direction, wherein the plurality of scan lines includes a plurality of first scan lines; each first scan line includes a first sub-first-scan-line and a second sub-first-scan-line; and the first sub-first-scan-line and the second sub-first-scan-line are respectively disposed on two sides of the functional device configuration region;

the first sub-first-scan-line and the second sub-first-scan-line are electrically connected with each other through a third connection line and a fourth connection line;

the third connection line extends along the first direction, and the fourth connection line extends along the second direction; and the third connection line and the plurality of first-wirings are fabricated in a same layer using a same material; and the fourth connection line and the plurality of second-wirings are fabricated in a same layer using a same material.

* * * * *